(12) United States Patent
Bhattacharjee

(10) Patent No.: US 9,466,430 B2
(45) Date of Patent: *Oct. 11, 2016

(54) VARIABLE CAPACITOR AND SWITCH STRUCTURES IN SINGLE CRYSTAL PIEZOELECTRIC MEMS DEVICES USING BIMORPHS

(71) Applicant: RF Micro Devices, Inc., Greensboro, NC (US)

(72) Inventor: Kushal Bhattacharjee, Kernersville, NC (US)

(73) Assignee: Qorvo US, Inc., Greensboro, NC (US)

(*) Notice: Subject to any disclaimer, the term of this patent is extended or adjusted under 35 U.S.C. 154(b) by 407 days.

This patent is subject to a terminal disclaimer.

(21) Appl. No.: 14/071,025

(22) Filed: Nov. 4, 2013

(65) Prior Publication Data

US 2014/0125201 A1 May 8, 2014

Related U.S. Application Data

(60) Provisional application No. 61/721,775, filed on Nov. 2, 2012, provisional application No. 61/723,457, filed on Nov. 7, 2012.

(51) Int. Cl.
*H01L 41/09* (2006.01)
*H03H 9/125* (2006.01)
(Continued)

(52) U.S. Cl.
CPC .............. *H01G 5/18* (2013.01); *B81B 3/0086* (2013.01); *H03H 9/02275* (2013.01); *H03H 9/02409* (2013.01); *H03H 9/2405* (2013.01); *H03H 9/2463* (2013.01); *H03H 9/467* (2013.01);
(Continued)

(58) Field of Classification Search
CPC ....................................................... H01G 5/18
USPC ......... 310/311–371; 333/186, 187, 189, 191, 333/197
See application file for complete search history.

(56) References Cited

U.S. PATENT DOCUMENTS

| 4,798,989 A | 1/1989 | Miyazaki et al. |
| 5,739,624 A | 4/1998 | Kleiman |

(Continued)

FOREIGN PATENT DOCUMENTS

| JP | S5778206 A | 5/1982 |
| JP | S5895690 A | 6/1983 |
| WO | 03042687 A1 | 5/2003 |

OTHER PUBLICATIONS

Notice of Allowance for U.S. Appl. No. 14/071,173, mailed Apr. 21, 2015, 8 pages.

(Continued)

*Primary Examiner* — Thomas Dougherty
(74) *Attorney, Agent, or Firm* — Withrow & Terranova, P.L.L.C.

(57) ABSTRACT

A micro-electrical-mechanical systems (MEMS) device includes a substrate, one or more anchors formed on a first surface of the substrate, and a piezoelectric layer suspended over the first surface of the substrate by the one or more anchors. A first electrode may be provided on a first surface of the piezoelectric layer facing the first surface of the substrate, such that the first electrode is in contact with a first bimorph layer of the piezoelectric layer. A second electrode may be provided on a second surface of the piezoelectric layer opposite the first surface, such that the second electrode is in contact with a second bimorph layer of the piezoelectric layer.

29 Claims, 21 Drawing Sheets

(51) Int. Cl.
*H03H 9/15* (2006.01)
*H01G 5/18* (2006.01)
*H03H 9/02* (2006.01)
*H03H 9/46* (2006.01)
*H03H 9/24* (2006.01)
*B81B 3/00* (2006.01)

(52) U.S. Cl.
CPC .. *B81B2201/018* (2013.01); *B81B 2201/0271* (2013.01); *B81B 2201/032* (2013.01); *H03H 9/462* (2013.01); *H03H 2009/241* (2013.01)

(56) References Cited

U.S. PATENT DOCUMENTS

| | | |
|---|---|---|
| 6,249,073 B1 | 6/2001 | Nguyen et al. |
| 6,336,366 B1 | 1/2002 | Thundat et al. |
| 6,349,454 B1 | 2/2002 | Manfra et al. |
| 6,437,486 B1 | 8/2002 | Burcsu et al. |
| 6,767,749 B2 | 7/2004 | Kub et al. |
| 6,909,221 B2 | 6/2005 | Ayazi et al. |
| 7,250,705 B2 | 7/2007 | Dewa et al. |
| 7,315,107 B2 | 1/2008 | Kando et al. |
| 7,492,241 B2 | 2/2009 | Piazza et al. |
| 7,586,239 B1* | 9/2009 | Li .................. H03H 3/0072 310/323.02 |
| 7,626,846 B2 | 12/2009 | Rao et al. |
| 7,639,105 B2* | 12/2009 | Ayazi .................. H03H 9/172 333/186 |
| 7,750,759 B1 | 7/2010 | Lee et al. |
| 7,898,158 B1* | 3/2011 | Li ................. H03H 9/02275 310/320 |
| 8,035,280 B2 | 10/2011 | Li et al. |
| 8,508,108 B2 | 8/2013 | Anand et al. |
| 9,117,593 B2* | 8/2015 | Bhattacharjee .... H03H 9/02275 |
| 2003/0006676 A1 | 1/2003 | Smith et al. |
| 2003/0119220 A1 | 6/2003 | Mlcak et al. |
| 2004/0125472 A1 | 7/2004 | Belt |
| 2005/0035687 A1 | 2/2005 | Xu et al. |
| 2005/0184627 A1 | 8/2005 | Sano et al. |
| 2006/0082256 A1 | 4/2006 | Bibl et al. |
| 2006/0131997 A1 | 6/2006 | Kim et al. |
| 2007/0200458 A1 | 8/2007 | Yoshino et al. |
| 2007/0209176 A1 | 9/2007 | Kawakubo et al. |
| 2007/0228887 A1 | 10/2007 | Nishigaki et al. |
| 2007/0284971 A1 | 12/2007 | Sano et al. |
| 2010/0194499 A1 | 8/2010 | Wang et al. |
| 2010/0237709 A1 | 9/2010 | Hall et al. |
| 2011/0181150 A1 | 7/2011 | Mahameed et al. |
| 2014/0183669 A1 | 7/2014 | Xu et al. |
| 2014/0210314 A1 | 7/2014 | Bhattacharjee et al. |
| 2014/0210315 A1 | 7/2014 | Bhattacharjee et al. |

OTHER PUBLICATIONS

Bannon, III, Frank D. et al., "High-Q HF Microelectromechanical Filters," IEEE Journal of Solid-State Circuits, vol. 35, No. 4, Apr. 2000, pp. 512-526.

Batchko, Robert G. et al., "Backswitch Poling in Lithium Niobate for High-Fidelity Domain Patterning and Efficient Blue Light Generation," Applied Physics Letters, vol. 75, No. 12, Sep. 20, 1999, pp. 1673-1675.

Brown, Paul T. et al., "Control of Domain Structures in Lithium Tantalate Using Interferometric Optical Patterning," Optics Communications, vol. 163, May 15, 1999, pp. 310-316.

Chandrahalim, Hengky et al., "Channel-Select Micromechanical Filters Using High-K Dielectrically Transduced MEMS Resonators," Proceedings of the 19th International IEEE Micro Electro Mechanical Systems Conference (MEMS 2006), Jan. 22-26, 2006, pp. 894-897, Istanbul, Turkey.

Chen, Yan-Feng et al., "High-Frequency Resonance in Acoustic Superlattice of Periodically Poled LiTaO3," Applied Physics Letters, vol. 70, No. 5, Feb. 3, 1997, pp. 592-594.

Courjon, E. et al., "Pure Longitudinal Plate Mode Excited by Poled Domains Transducers on LiNbO3," Proceedings, EFTF*IEEE-FCS'07, May 29-Jun. 1, 2007, pp. 1073-1076.

Feld, David et al., "A High Performance 3.0 mm x 3.0 mm x 1.1 mm FBAR Full Band Tx Filter for U.S. PCS Handsets," 2002 IEEE Ultrasonics Symposium, 2002, pp. 913-918.

Ho, Gavin K. et al., "High-Order Composite Bulk Acoustic Resonators," Technical Digest, IEEE Int. Conf. on Micro Electro Mechanical Systems (MEMS), Jan. 21-25, 2007, pp. 791-794, Kobe, Japan.

Hsu, Wan-Thai et al., "Stiffness-Compensated Temperature-Insensitive Micromechanical Resonators," Technical Digest, IEEE International Conference on Micro Electro Mechanical Systems, 2002, pp. 731-734, Las Vegas, NV.

Kim, Bongsang et al., "Frequency Stability of Wafer-Scale Encapsulated MEMS Resonators," Proceedings of the 13th International Conference on Solid-State Sensors, Actuators and Microsystems, Jun. 5-9, 2005, Seoul, Korea.

Kondo, Jungo et al., "High-Speed and Low-Driving-Voltage Thin-Sheet X-Cut LiNbO3 Modulator with Laminated Low-Dielectric-Constant Adhesive," IEEE Photonics Technology Letters, vol. 17, No. 10, Oct. 2005, pp. 2077-2079.

Kumar, A. K. Sarin et al., "High-Frequency Surface Acoustic Wave Device Based on Thin-Film Piezoelectric Interdigital Transducers," Applied Physics Letters, vol. 85, No. 10, Sep. 6, 2004, pp. 1757-1759.

Li, Sheng-Shian et al., "Micromechanical 'Hollow-Disk' Ring Resonators," Technical Digest, IEEE International Conference on Micro Electro Mechanical Systems, 2004, pp. 821-824, Maastricht, the Netherlands.

Li, Sheng-Shian et al., "Self-Switching Vibrating Micromechanical Filter Bank," Proceedings of the Joint IEEE Int. Frequency Control/Precision Time & Time Interval Symposium, Aug. 29-31, 2005, pp. 135-141, Vancouver, Canada.

Liu, Xiaoyan et al., "Nanoscale Chemical Etching of Near-Stoichiometric Lithium Tantalate," Journal of Applied Physics, vol. 97, 2005, pp. 064308-1 to 064308-4.

Majjad, H. et al., "Low Temperature Bonding of Interface Acoustic Waves Resonators on Silicon Wafers," Proceedings of the 2005 IEEE Ultrasonics Symposium, 2005, pp. 1307-1310.

Myers, L. E. et al., "Quasi-Phase-Matched Optical Parametric Oscillators in Bulk Periodically Poled LiNbO3," J. Opt. Soc. Am. B, vol. 12, No. 11, Nov. 1995, pp. 2102-2116.

Ostrovskii, I. V. et al., "Free Vibration of Periodically Poled Ferroelectric Plate," Journal of Applied Physics, vol. 99, No. 114106, 2006, pp. 114106-1 to 114106-6.

Osugi, Yukihisa et al., "Single Crystal FBAR with LiNbO3 and LiTaO3 Piezoelectric Substance Layers," Proceedings of the International Microwave Symposium Jun. 3-8, 2007, pp. 873-876, Honolulu, Hawaii.

Pastureaud, Thomas et al., "High-Frequency Surface Acoustic Waves Excited on Thin-Oriented LiNbO3 Single-Crystal Layers Transferred Onto Silicon," IEEE Transactions on Ultrasonics, Ferroelectrics, and Frequency Control, vol. 54, No. 4, Apr. 2007, pp. 870-876.

Piazza, G. et al., "Low Motional Resistance Ring-Shaped Contour-Mode Aluminum Nitride Piezoelectric Micromechanical Resonators for UHF Applications," Proceedings of the 18th International IEEE Micro Electro Mechanical Systems Conference, Jan. 30-Feb. 3, 2005, pp. 20-23, Miami, Florida.

Author Unknown, "Soitec Innovative Process for Materials Treatments—Smart Cut(R)," Soitec, Retrieved: Apr. 20, 2010, 1 page, www.soitec.com.

Stephanou, P. J. et al., "GHz Contour Extensional Mode Aluminum Nitride MEMS Resonators," 2006 IEEE Ultrasonics Symposium, Oct. 3-6, 2006, pp. 2401-2404.

Stephanou, P.J. et al., "GHz Higher Order Contour Mode ALN Annular Resonators," Technical Digest of the IEEE International Conference on Micro Electro Mechanical Systems, 2007, Kobe, Japan.

Wang, Jing et al., "1.14-GHz Self-Aligned Vibrating Micromechanical Disk Resonator," Technical Digest of the 2003

(56) References Cited

OTHER PUBLICATIONS

Radio Frequency Integrated Circuits Symposium, Jun. 8-10, 2003, pp. 335-338, Philadelphia, Pennsylvania.
Wong, Ark-Chew et al., "Micromechanical Mixer-Filters ('Mixlers')," Journal of Microelectromechanical Systems, vol. 13, No. 1, Feb. 2004, pp. 100-112.
Yamada, M. et al., "First-Order Quasi-Phase Matched LiNbO3 Waveguide Periodically Poled by Applying an External Field for Efficient Blue Second-Harmonic Generation," Applied Physics Letters, vol. 62, No. 5 Feb. 1, 1993, pp. 435-436.
Zhu, Yong-Yuan et al., "Crossed Field Excitation of an Acoustic Supperlattice," Journal of Physics D: Applied Physics, vol. 29, 1996, pp. 185-187.
Zhu, Yong-Yuan et al., "Ultrasonic Excitation and Propagation in an Acoustic Supperlattice," Journal of Applied Physics, vol. 72, No. 3, Aug. 1, 1992, pp. 904-914.
Notice of Allowance for U.S. Appl. No. 12/134,483, mailed Mar. 24, 2009, 6 pages.
Notice of Allowance for U.S. Appl. No. 12/263,883, mailed Oct. 28, 2010, 6 pages.
Nakamura, Kiyoshi et al., "Local Domain Inversion in Ferroelectric Crystals and Its Application to Piezoelectric Devices," 1989 Ultrasonics Symposium, Copyright: 1989, pp. 309-318.
Aigner, R. et al., "Advancement of MEMS into RF-Filter Applications," IEDM: International Electron Devices Meeting, Dec. 8-11, 2002, pp. 897-900, San Francisco CA.
Aigner, Robert et al., "Bulk-Acoustic-Wave Filters: Performance Optimization and Volume Manufacturing," IEEE MTT-S Digest, 2003, pp. 2001-2004.
Author Unknown, "An American National Standard: IEEE Standard on Piezoelectricity," ANSI/IEEE Std 176-1987, Copyright: 1988, 74 pages, The Institute of Electrical and Electronics Engineers, Inc., New York, NY.
Author Unknown, "Standards on Piezoelectric Crystals, 1949," Proceedings of the I.R.E., Dec. 1949, pp. 1378-1395.
Bassignot, F. et al., "A new acoustic resonator concept based on acoustic waveguides using silicon/periodically poled transducer/silicon structures for RF applications," 2011 Joint Conference of the IEEE International Frequency Control and the European Frequency and Time Forum (FCS), 6 pages.
Courjon, E. et al., "Periodically Poled Transducers Built on Single Crystal Lithium Niobate Layers Bonded onto Silicon," IEEE Ultrasonics Symposium, 2007, pp. 268-271.
Hannon, John J. et al., "Lithium Tantalate and Lithium Niobate Piezoelectric Resonators in the Medium Frequency Range With Low Ratios of Capacitance and Low Temperature Coefficients of Frequency," IEEE Transactions on Sonics and Ultrasonics, vol. SU-17, No. 4, Oct. 1970, pp. 239-246.
Iula, Antonio et al., "A Model for the Theoretical Characterization of Thin Piezoceramic Rings," IEEE Transactions on Ultrasonics, Ferroelectrics, and Frequency Control, vol. 43, No. 3, May 1996, pp. 370-375.
Kadota, Michio et al., "High Frequency Lamb Wave Resonator using LiNbO3 Crystal Thin Plate and Application to Tunable Filter," 2010 IEEE International Ultrasonics Symposium Proceedings, 2010, pp. 962-965.
Kovacs, G. et al., "Improved Material Constants for LiNbO3 and LiTaO3," 1990 Ultrasonics Symposium, Copyright: 1990, pp. 435-438.
Onoe, Morio et al., "Zero Temperature Coefficient of Resonant Frequency in an X-Cut Lithium Tantalate at Room Temperature," Proceedings of the IEEE: Proceedings Letters, Aug. 1969, pp. 1446-1448.
Ruby, R. et al., "PCS 1900 MHz Duplexer Using Thin Film Bulk Acoustic Resonators (FBARs)," Electronics Letters, vol. 35, No. 10, May 13, 1999, pp. 794-795.
Ruby, Richard C. et al., "Thin Film Bulk Wave Acoustic Resonators (FBAR) for Wireless Applications," 2001 IEEE Ultrasonics Symposium, 2001, pp. 813-821.
Ruby, Richard et al., "Ultra-Miniature High-Q Filters and Duplexers Using FBAR Technology," 2001 IEEE International Solid-State Circuits Conference, Feb. 6, 2001, 3 pages.
Sliker, T. R. et al., "Frequency-Temperature Behavior of X-Cut Lithium Tantalate Resonators," Proceedings of the IEEE, Aug. 1968, p. 1402.
Smith, R. T. et al., "Temperature Dependence of the Elastic, Piezoelectric, and Dielectric Constants of Lithium Tantalate and Lithium Niobate," Journal of Applied Physics, vol. 42, No. 6, May 1971, pp. 2219-2230.
Wang, Jing et al., "1.156-GHz Self-Aligned Vibrating Micromechanical Disk Resonator," IEEE Transactions on Ultrasonics, Ferroelectrics, and Frequency Control, vol. 51, No. 12, Dec. 2004, pp. 1607-1628.
Warner, A. W. et al., "Low Temperature Coefficient of Frequency in a Lithium Tantalate Resonator," Proceedings of the IEEE, Mar. 1967, p. 450.
Weisstein, Eric W., "Euler Angles," MathWorld—A Wolfram Web Resource, Retrieved: Apr. 29, 2009, http://mathworld.wolfram.com/EulerAngles.html, 4 pages.
Notice of Allowance for U.S. Appl. No. 13/037,584, mailed Jun. 9, 2011, 7 pages.
Non-Final Office Action for U.S. Appl. No. 12/202,624, mailed May 18, 2012, 8 pages.
Final Office Action for U.S. Appl. No. 12/202,624, mailed Jul. 27, 2012, 8 pages.
Advisory Action for U.S. Appl. No. 12/202,624, mailed Sep. 7, 2012, 3 pages.
Non-Final Office Action for U.S. Appl. No. 12/202,624, mailed Mar. 5, 2014, 8 pages.
Non-Final Office Action for U.S. Appl. No. 12/202,624, mailed Apr. 9, 2015, 7 pages.
Notice of Allowance for U.S. Appl. No. 14/031,383, mailed Mar. 14, 2016, 8 pages.
Notice of Allowance for U.S. Appl. No. 14/031,454, mailed Mar. 4, 2016, 8 pages.

* cited by examiner

VARIABLE CAPACITOR AND SWITCH STRUCTURES IN SINGLE CRYSTAL PIEZOELECTRIC MEMS DEVICES USING BIMORPHS

RELATED APPLICATIONS

This application claims the benefit of U.S. provisional patent application Ser. No. 61/721,775, filed Nov. 2, 2012 and U.S. provisional patent application Ser. No. 61/723,457 filed Nov. 7, 2012, the disclosures of which are incorporated herein by reference in their entireties.

FIELD OF THE DISCLOSURE

The present disclosure relates to micro-electrical-mechanical systems (MEMS) structures for creating variable capacitors, switches, resonators, and filters.

BACKGROUND

Micro-electrical-mechanical systems (MEMS) devices are currently being developed for a wide variety of applications. A MEMS device generally includes at least one mechanical element, such as a sensor, an actuator, or a resonator, that is formed using a micromachining process that selectively etches away parts of a wafer. The wafer may include added structural layers and may be made of a semiconductor material, such as Silicon. Several devices, such as resonators, filters, capacitors, and switches may be advantageously developed as MEMS devices due to the size, cost, and power consumption advantages afforded therefrom.

Many MEMS devices rely on the piezoelectric effect of one or more layers in the device to mechanically actuate or resonate in order to provide the functionality of the device. One particularly interesting piezoelectric material is the piezoelectric bimorph, in which a first piezoelectric layer having a first set of piezoelectric properties is placed on top of a second piezoelectric layer having a second set of piezoelectric properties. Notably, the piezoelectric properties of the first piezoelectric layer and the second piezoelectric layer are different, such that when the layers are electrically activated, one of the layers may expand or contract more than the other, causing the piezoelectric bimorph to mechanically deform more than would otherwise be possible using a single layer of piezoelectric material.

Although MEMS devices currently exist for a wide variety of applications, many of the devices are difficult to manufacture, provide sub-optimal performance, or are only fit for a single purpose. Accordingly, there is an ongoing need for improved MEMS devices and structures.

SUMMARY

The present disclosure relates to micro-electrical-mechanical systems (MEMS) device structures for generating variable capacitors and switches. According to one embodiment, a MEMS device includes a substrate, one or more anchors formed on a first surface of the substrate, and a piezoelectric layer suspended over the first surface of the substrate by the one or more anchors. Notably, the piezoelectric layer may be a piezoelectric bimorph including a first bimorph layer and a second bimorph layer. A first electrode may be provided on a first surface of the piezoelectric layer facing the first surface of the substrate, such that the first electrode is in contact with the first bimorph layer of the piezoelectric layer. A second electrode may be provided on a second surface of the piezoelectric layer opposite the first surface, such that the second electrode is in contact with the second bimorph layer of the piezoelectric layer.

Dividing the piezoelectric layer of the MEMS device into the first bimorph layer and the second bimorph layer causes a larger amount of mechanical deformation when the layer is electrically activated as compared to a single piezoelectric layer, thereby leading to a greater amount of deflection between the piezoelectric layer and the substrate. The larger amount of deflection afforded by the use of the piezoelectric layer allows for a more significant effect on one or more properties of the MEMS device, for example, the capacitance between the first electrode and the second electrode, and may further offer increased functionality of the MEMS device.

According to one embodiment, a direct current (DC) voltage is applied between the first electrode and the second electrode, which generates one or more changes in the piezoelectric layer. For example, the piezoelectric layer may mechanically deform in response to the DC voltage in order to modulate the elastic properties of the layer, the piezoelectric properties of the layer, the dielectric constants of the layer, and the distance between the first electrode and the second electrode. Accordingly, a capacitance between the first electrode and the second electrode may be controllable by the level of the DC voltage placed between the first electrode and the second electrode.

According to one embodiment, the MEMS device includes a substrate, one or more anchors formed on a first surface of the substrate, and a piezoelectric layer suspended over the first surface of the substrate by the one or more anchors. Notably, the piezoelectric layer may be a piezoelectric bimorph including a first bimorph layer and a second bimorph layer. A first electrode may be provided on a first surface of the piezoelectric layer facing the first surface of the substrate, such that the first electrode is in contact with the first bimorph layer of the piezoelectric layer. A second electrode may be provided on a second surface of the piezoelectric layer opposite the first surface, such that the second electrode is in contact with the second bimorph layer of the piezoelectric layer. A third electrode may be provided on the first surface of the substrate beneath the first electrode.

According to one embodiment, a DC voltage is applied between the first electrode and the second electrode, which generates one or more changes in the piezoelectric layer. For example, the piezoelectric layer may mechanically deform in response to the DC voltage in order to modulate the elastic properties of the layer, the piezoelectric properties of the layer, the dielectric constants of the layer, the distance between the first electrode and the second electrode, and the distance between the first electrode and the third electrode. Accordingly, a capacitance between the first electrode and the third electrode may be controllable by the level of the DC voltage placed between the first electrode and the second electrode.

According to one embodiment, a DC voltage is applied between the first electrode and the second electrode, which generates one or more changes in the piezoelectric layer. For example, the piezoelectric layer may mechanically deform in response to the DC voltage such that the first electrode comes into contact with the third electrode. Accordingly, the first electrode and the third electrode may be selectively connected to one another based on the DC voltage placed between the first electrode and the second electrode.

According to one embodiment, the MEMS device includes a substrate, one or more anchors formed on a first surface of the substrate, and a piezoelectric layer suspended over the first surface of the substrate by the one or more anchors. Each of the one or more anchors includes at least one piezoelectric anchor layer. Notably, the piezoelectric anchor layer may be a piezoelectric bimorph including a first bimorph layer and a second bimorph layer. A first electrode may be provided on a first surface of the piezoelectric layer and the piezoelectric anchor layer facing the first surface of the substrate, such that the first electrode is in contact with the first bimorph layer of the piezoelectric anchor layer. A second electrode may be provided on a second surface of piezoelectric layer and the piezoelectric anchor layer opposite the first surface, such that the second electrode is in contact with the second bimorph layer of the piezoelectric anchor layer. A third electrode may be provided on the first surface of the substrate beneath the first electrode.

According to one embodiment, a DC voltage is applied between the first electrode and the second electrode, which generates one or more changes in the piezoelectric anchor layer. For example, the piezoelectric anchor layer may mechanically deform in response to the DC voltage in order to modulate the distance between the first electrode and the third electrode. Accordingly, the capacitance between the first electrode and the third electrode may be controllable by the level of the DC voltage placed between the first electrode and the second electrode. Alternatively, the first electrode and the third electrode may be selectively connected to one another based on the DC voltage placed between the first electrode and the second electrode.

Those skilled in the art will appreciate the scope of the disclosure and realize additional aspects thereof after reading the following detailed description in association with the accompanying drawings.

BRIEF DESCRIPTION OF THE DRAWINGS

The accompanying drawings incorporated in and forming a part of this specification illustrate several aspects of the disclosure, and together with the description serve to explain the principles of the disclosure.

DETAILED DESCRIPTION

The embodiments set forth below represent the necessary information to enable those skilled in the art to practice the disclosure and illustrate the best mode of practicing the disclosure. Upon reading the following description in light of the accompanying drawings, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Figure 1:
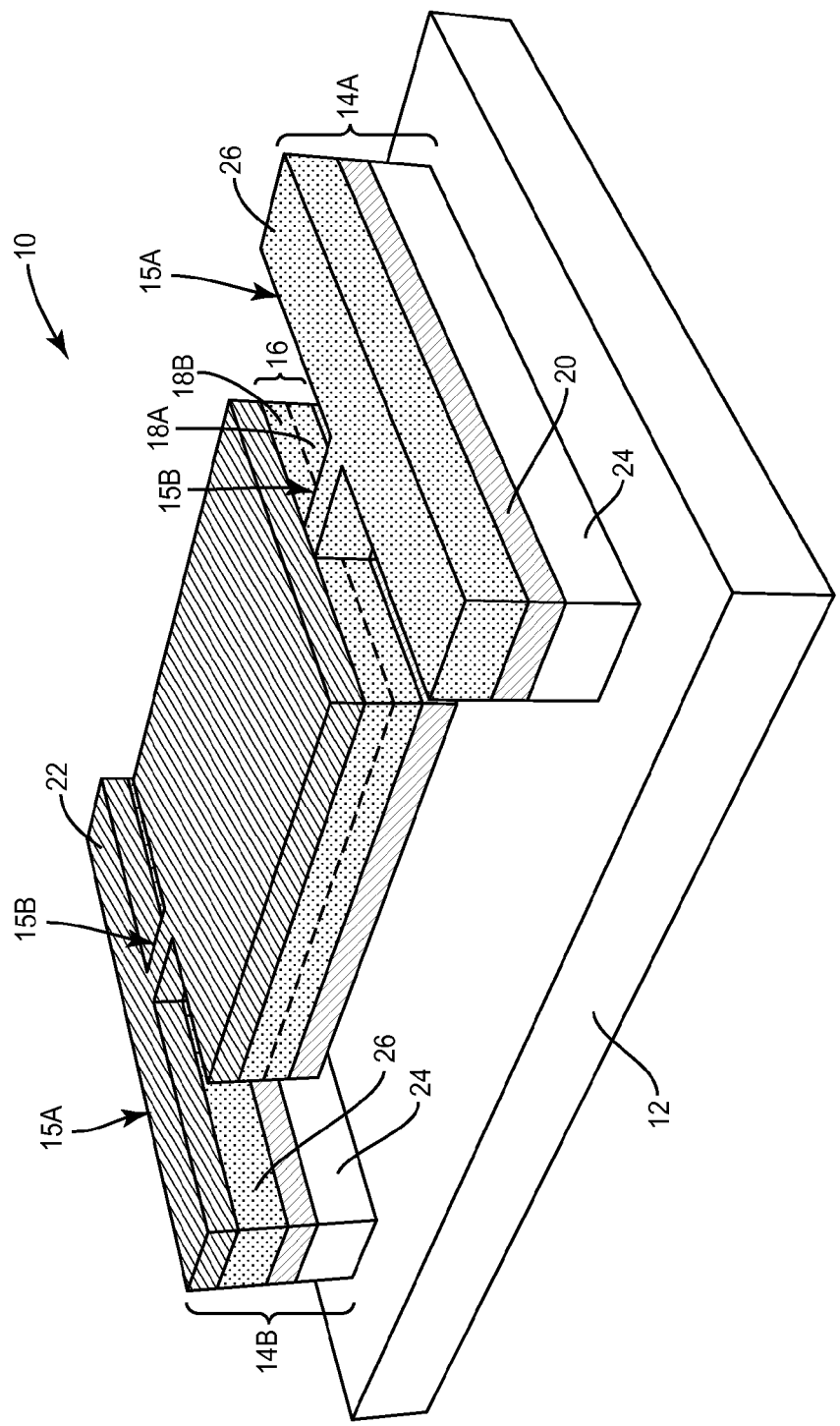
FIG. 1 shows a three-dimensional representation of a rectangular micro-electrical-mechanical systems (MEMS) device according to one embodiment of the present disclosure.

Turning now to FIG. 1, a MEMS device 10 is shown according to one embodiment of the present disclosure. The MEMS device 10 may include a substrate 12, a first anchor 14A formed on a first surface of the substrate 12, a second anchor 14B also formed on the first surface of the substrate, and a piezoelectric layer 16 suspended between the first anchor 14A and the second anchor 14B. Notably, the piezoelectric layer 16 may be a piezoelectric bimorph including a first bimorph layer 18A and a second bimorph layer 18B. The first anchor 14A and the second anchor 14B may include an anchor portion 15A, which is located on the first surface of the substrate 12, and a mechanical support member 15B, which couples the anchor portion 15A to the piezoelectric layer 16. A first electrode 20 may be located on a first surface of the piezoelectric layer 16, such that the first electrode 20 is in contact with the first bimorph layer 18A. Further, the first electrode 20 may extend over a portion of the first anchor 14A and the second anchor 14B. A second electrode 22 may be located on a second surface of the piezoelectric layer 16 opposite the first surface, such that the second electrode 22 is in contact with the second bimorph layer 18B. Further, the second electrode 22 may extend over a portion of the second anchor 14B. The first anchor 14A and the second anchor 14B may comprise a first anchor layer 24 and a second anchor layer 26, which may be separated by the first electrode 20. Further, the second anchor layer 26 may extend throughout both the anchor portion 15A and the mechanical support member 15B of each one of the anchors.

As shown in FIG. 1, the piezoelectric layer 16 is rectangular, with each one of the first electrode 20 and the second electrode 22 covering the first surface and the second surface of the piezoelectric layer 16, respectively. Those of ordinary skill in the art will appreciate that the principles of the present disclosure may be applied to piezoelectric layers having any shape or dimensions without departing from the principles of the present disclosure. Further, although only two anchors 14A and 14B are shown in FIG. 1, those of ordinary skill in the art will appreciate that the principles of the present disclosure may be applied to MEMS devices having any number of anchors without departing from the principles of the present disclosure.

According to one embodiment, each one of the first bimorph layer 18A and the second bimorph layer 18B of the piezoelectric layer 16 is a single crystal piezoelectric material having a uniform crystalline orientation. For example, the piezoelectric layer 16 may be Lithium Niobate, Lithium Tantalate, Quartz, Langasite, Langanate, Langatate, Potassium Niobate, or any combination thereof. The substrate 12 may be, for example, Lithium Tantalate, Lithium Niobate, Quartz, Silicon, Gallium Arsenide, Langasite, Langanate, Langatate, Potassium Niobate, or any combination thereof. The first anchor layer 24 of the first anchor 14A and the second anchor 14B may be, for example, Silicon Oxide, or a similar material. Those of ordinary skill in the art will appreciate that the principles of the present disclosure may be applied to MEMS devices using any materials system without departing from the principles of the present disclosure.

As will be appreciated by those of ordinary skill in the art, the first bimorph layer 18A of the piezoelectric layer 16 is at least partially domain inverted with respect to the second bimorph layer 18B in order to generate a greater amount of mechanical deformation when compared to a piezoelectric layer having only a single layer. Accordingly, a large amount of deflection can be achieved between the piezoelectric layer 16 and the substrate 12. The large amount of deflection afforded by the use of the piezoelectric layer 16 may allow for a more substantial effect on one or more properties of the MEMS device 10. For example, the large amount of deflection may allow for significant modulation of the capacitance between the first electrode 20 and the second electrode 22 based on a biasing voltage applied between the electrodes, as will be discussed in further detail below.

In operation, a direct current (DC) voltage may be applied between the first electrode 20 and the second electrode 22. The DC voltage may cause the piezoelectric layer 16 to mechanically deform, which may in turn cause changes in the elastic properties of the layer, the piezoelectric properties of the layer, the dielectric constants of the layer, and the distance between the first electrode 20 and the second electrode 22. The aforementioned changes in the piezoelectric layer 16 may lead to a change in the capacitance between the first electrode 20 and the second electrode 22. By carefully placing the anchors 14A and 14B in the MEMS device 10, the mechanical deformation of the piezoelectric layer 16 can be controlled with some degree of precision. Accordingly, the capacitance between the first electrode 20 and the second electrode 22 can be controlled by the level of the DC voltage placed between the first electrode 20 and the second electrode 22.

As will be appreciated by those of ordinary skill in the art, using the electrostatic voltage applied across the piezoelectric layer 16 to vary the capacitance between the first electrode 20 and the second electrode 22 will result in a highly linear capacitor when compared to prior art "air gap" variable capacitor solutions.

Figure 2:
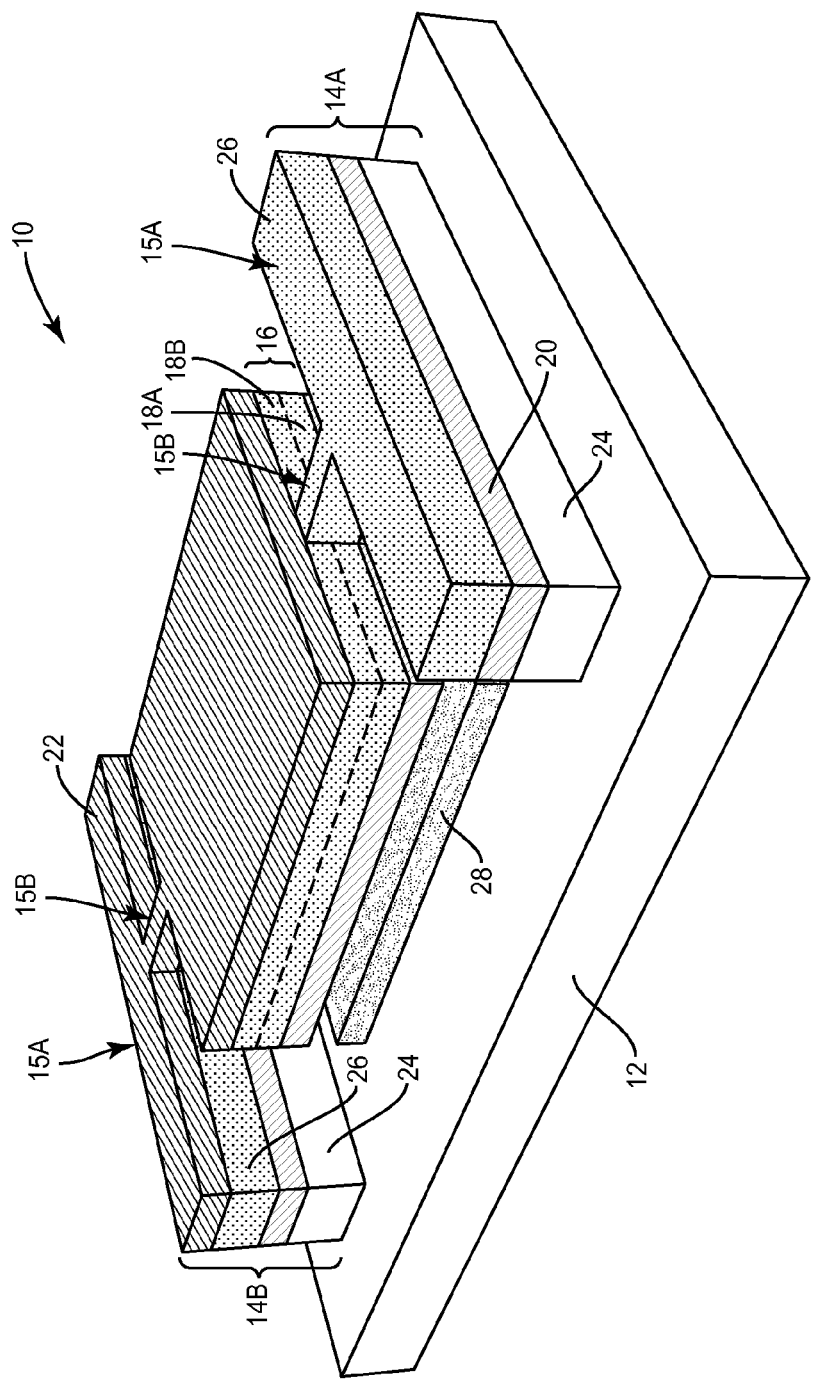
FIG. 2 shows a three-dimensional representation of the rectangular MEMS device shown in FIG. 1 according to an additional embodiment of the present disclosure.

FIG. 2 shows the MEMS device 10 of FIG. 1 further including a third electrode 28 on the first surface of the substrate 12 below the first electrode 20. The MEMS device 10 shown in FIG. 2 may function substantially similar to that shown in FIG. 1, wherein a DC voltage is applied between the first electrode 20 and the second electrode 22 in order to modulate the capacitance between the first electrode 20 and the second electrode 22. Alternatively, or simultaneously, a DC voltage may be placed between the first electrode 20 and the second electrode 22 in order to modulate a capacitance between the first electrode 20 and the third electrode 28. As discussed above, when a DC voltage is placed between the first electrode 20 and the second electrode 22, the piezoelectric layer 16 mechanically deforms, leading to changes in the elastic properties of the layer, the piezoelectric properties of the layer, the dielectric constants of the layer, the distance between the first electrode 20 and the second electrode 22, and the distance between the first electrode 20 and the third electrode 28.

By carefully placing the anchors 14A and 14B in the MEMS device 10, the mechanical deformation of the piezoelectric layer 16 can be controlled with some degree of precision. Accordingly, the capacitance between the first electrode 20 and the third electrode 28 can be controlled by the level of the DC voltage placed between the first electrode 20 and the second electrode 22. Further, at a certain level of the DC voltage, the deflection between the piezoelectric layer 16 and the substrate 12 will become large enough that the first electrode 20 contacts the third electrode 28. Accordingly, the DC voltage may be used to selectively place the first electrode 20 into contact with the third electrode 28 in order to form a switch.

Figure 3:
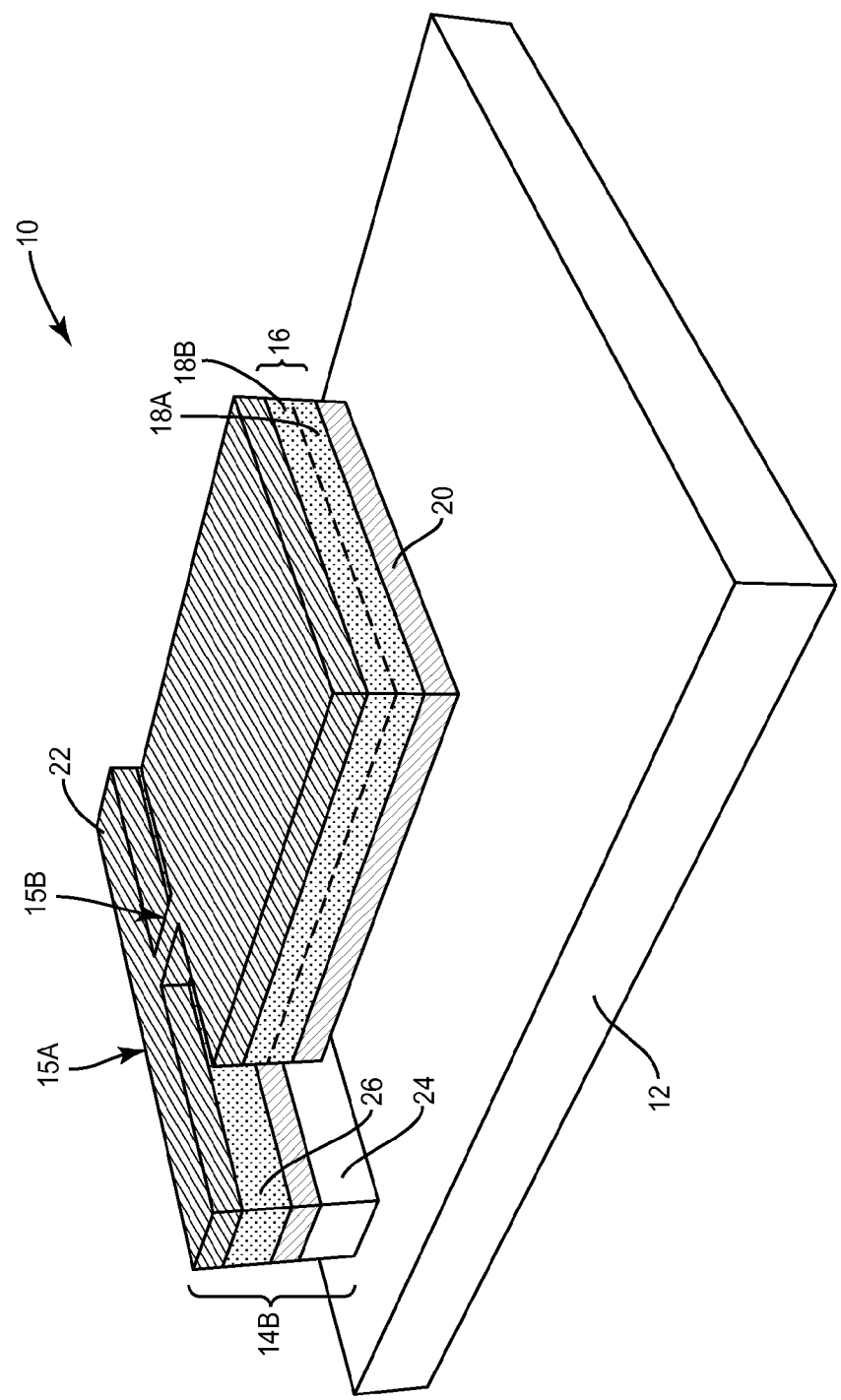
FIG. 3 shows a three-dimensional representation of a rectangular MEMS device according to one embodiment of the present disclosure.

FIG. 3 shows the MEMS device 10 shown in FIG. 1 according to an additional embodiment of the present disclosure. The MEMS device 10 shown in FIG. 3 is substantially similar to that shown in FIG. 1, except the MEMS device 10 shown in FIG. 3 does not include the first anchor 14A, such that the MEMS device 10 includes only a single anchor. Using only a single anchor may allow for a greater amount of deflection between the piezoelectric layer 16 and the substrate 12, thereby allowing the capacitance between the first electrode 20 and the second electrode 22 to be adjusted over a wider range of values. As discussed above, when a DC voltage is placed between the first electrode 20 and the second electrode 22, the piezoelectric layer 16 mechanically deforms, leading to changes in the elastic properties of the layer, the piezoelectric properties of the layer, the dielectric constants of the layer, and the distance between the first electrode and the second electrode. By carefully placing the single anchor 14B in the MEMS device 10, the mechanical deformation of the piezoelectric layer 16 can be controlled with some degree of precision. Accordingly, the capacitance between the first electrode 20 and the second electrode 22 can be controlled by the level of the DC voltage placed between the first electrode 20 and the second electrode 22.

Figure 4:
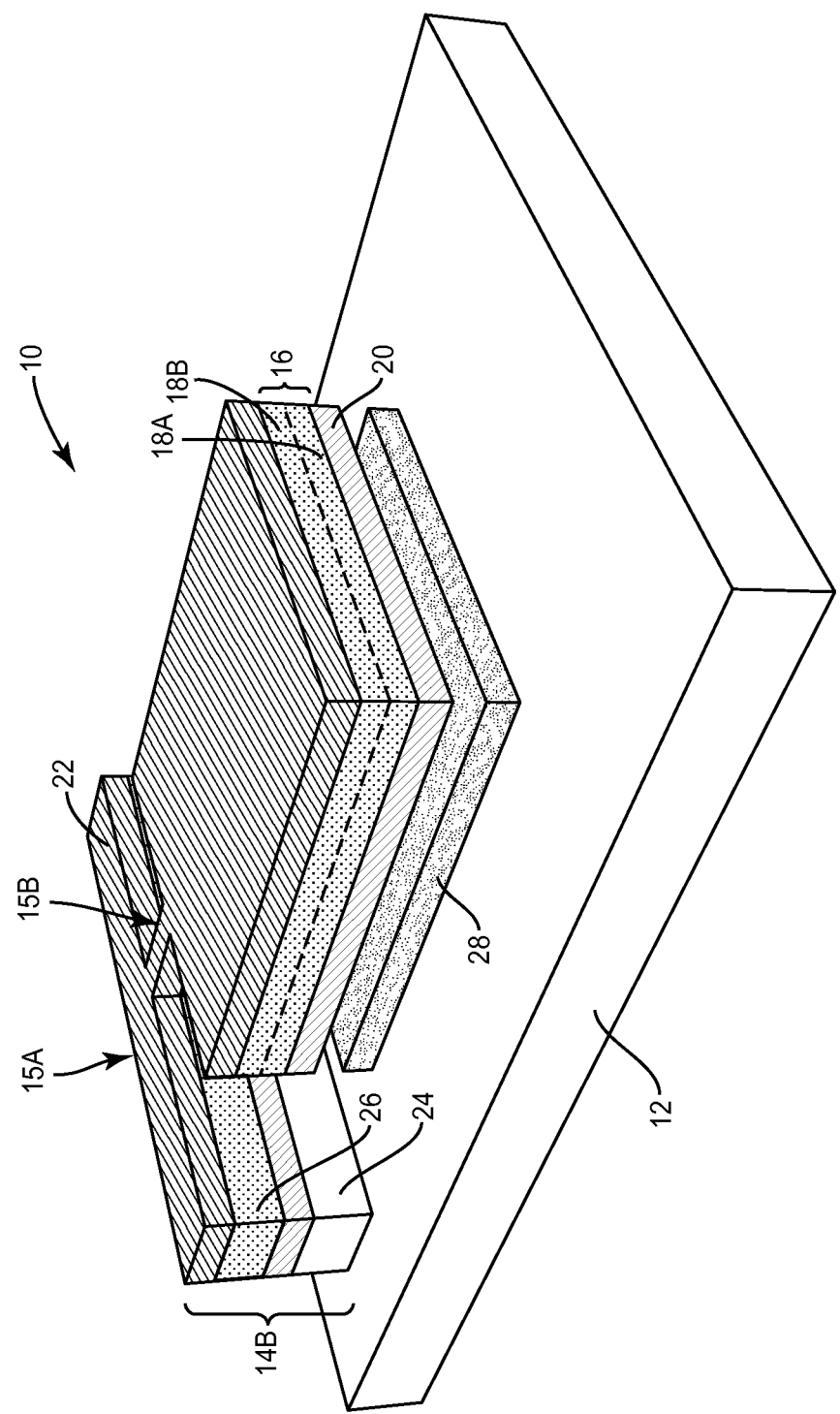
FIG. 4 shows a three-dimensional representation of the rectangular MEMS device shown in FIG. 3 according to an additional embodiment of the present disclosure.

FIG. 4 shows the MEMS device of FIG. 3 further including a third electrode 28 on the first surface of the substrate 12 below the first electrode 20. The MEMS device 10 shown in FIG. 4 may function substantially similar to that shown in FIG. 3, wherein a DC voltage is applied between the first electrode 20 and the second electrode 22 in order to modulate the capacitance between the first electrode 20 and the second electrode 22. Alternatively, or simultaneously, a DC voltage may be placed between the first electrode 20 and the second electrode 22 in order to modulate a capacitance between the first electrode 20 and the third electrode 28. As discussed above, when a DC voltage is placed between the first electrode 20 and the second electrode 22, the piezoelectric layer 16 mechanically deforms, leading to changes in the elastic properties of the layer, the piezoelectric properties of the layer, the dielectric constants of the layer, the distance between the first electrode 20 and the second electrode 22, and the distance between the first electrode 20 and the third electrode 28.

By carefully placing the second anchor 14B in the MEMS device 10, the mechanical deformation of the piezoelectric layer 16 can be controlled with some degree of precision. Accordingly, the capacitance between the first electrode 20 and the third electrode 28 can be controlled by the level of the DC voltage placed between the first electrode 20 and the second electrode 22. Further, at a certain level of the DC voltage, the deflection between the piezoelectric layer 16 and the substrate 12 may become large enough that the first electrode 20 contacts the third electrode 28. Accordingly, the DC voltage may be used to selectively place the first electrode 20 into contact with the third electrode 28 in order to form a switch. As discussed above, using only a single anchor 14B in the MEMS device 10 may allow for a larger amount of deflection between the piezoelectric layer 16 and the substrate 12. Accordingly, the capacitance between the first electrode 20 and the third electrode 28 may be adjusted over a wider range of values. Further, using only the single second anchor 14B may allow the first electrode 20 to more easily be placed in contact with the third electrode 28 in order to form a switch.

As will be appreciated by those of ordinary skill in the art, providing more or less anchors on the MEMS device 10 will affect the performance characteristics thereof. For example, although omitting the first anchor 14A from the MEMS device 10 allows for a larger amount of deflection between the piezoelectric layer 16 and the substrate 12, doing so will also result in less stabilization of the piezoelectric layer 16, resulting in a lower quality factor of the MEMS device 10.

Figure 5:
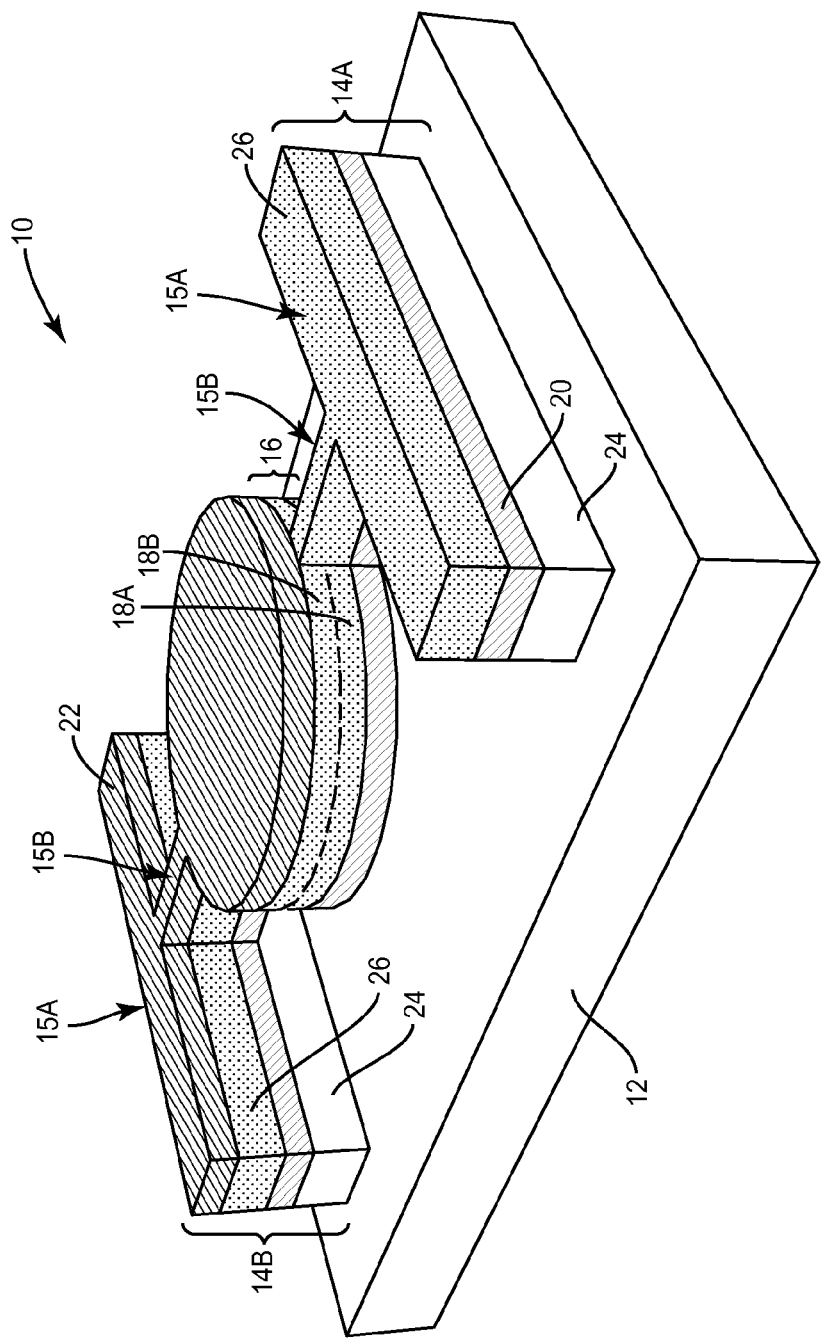
FIG. 5 shows a three-dimensional representation of a disk-shaped MEMS device according to one embodiment of the present disclosure.
Figure 6:
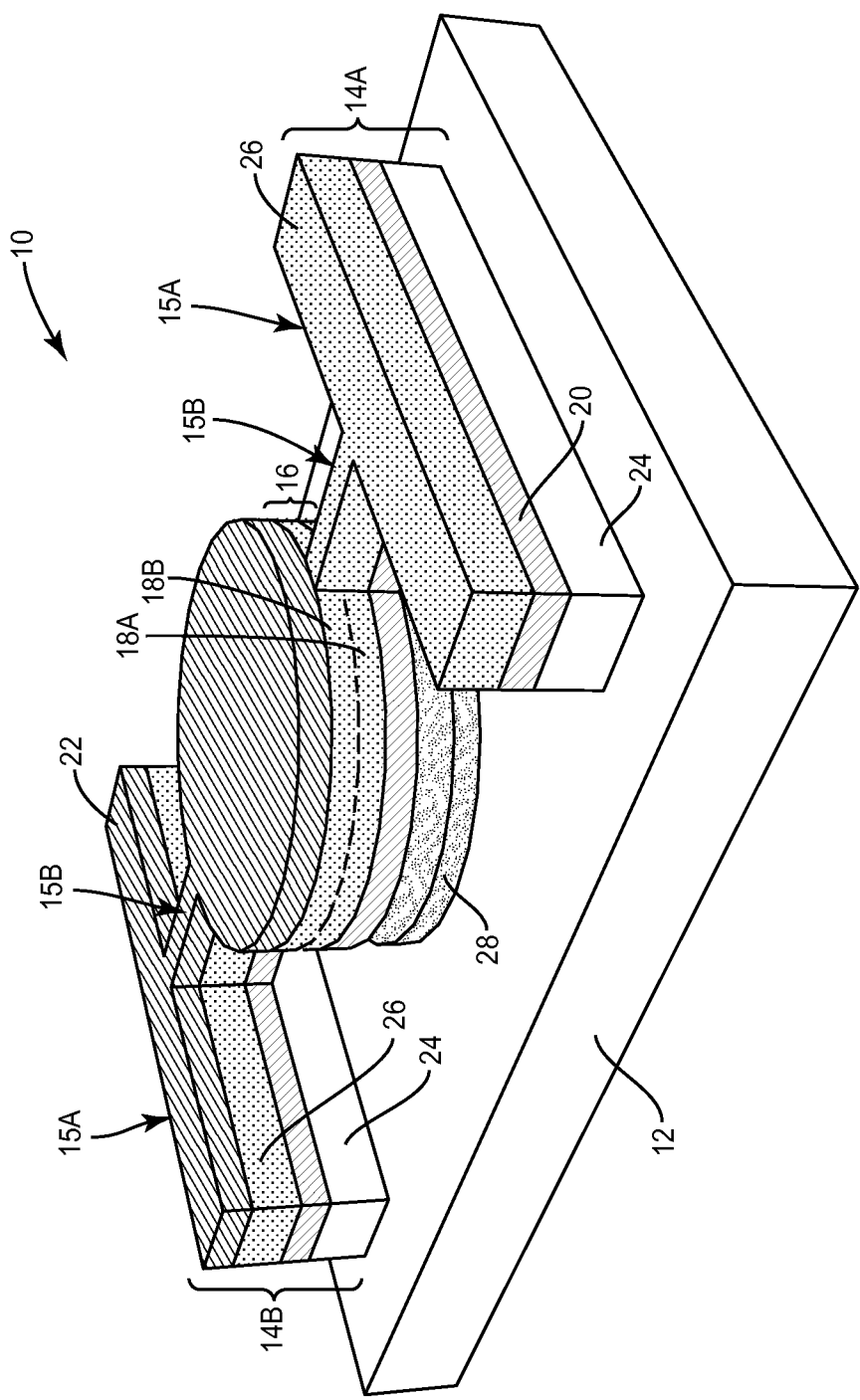
FIG. 6 shows a three-dimensional representation of the disk-shaped MEMS device shown in FIG. 5 according to an additional embodiment of the present disclosure.
Figure 7:
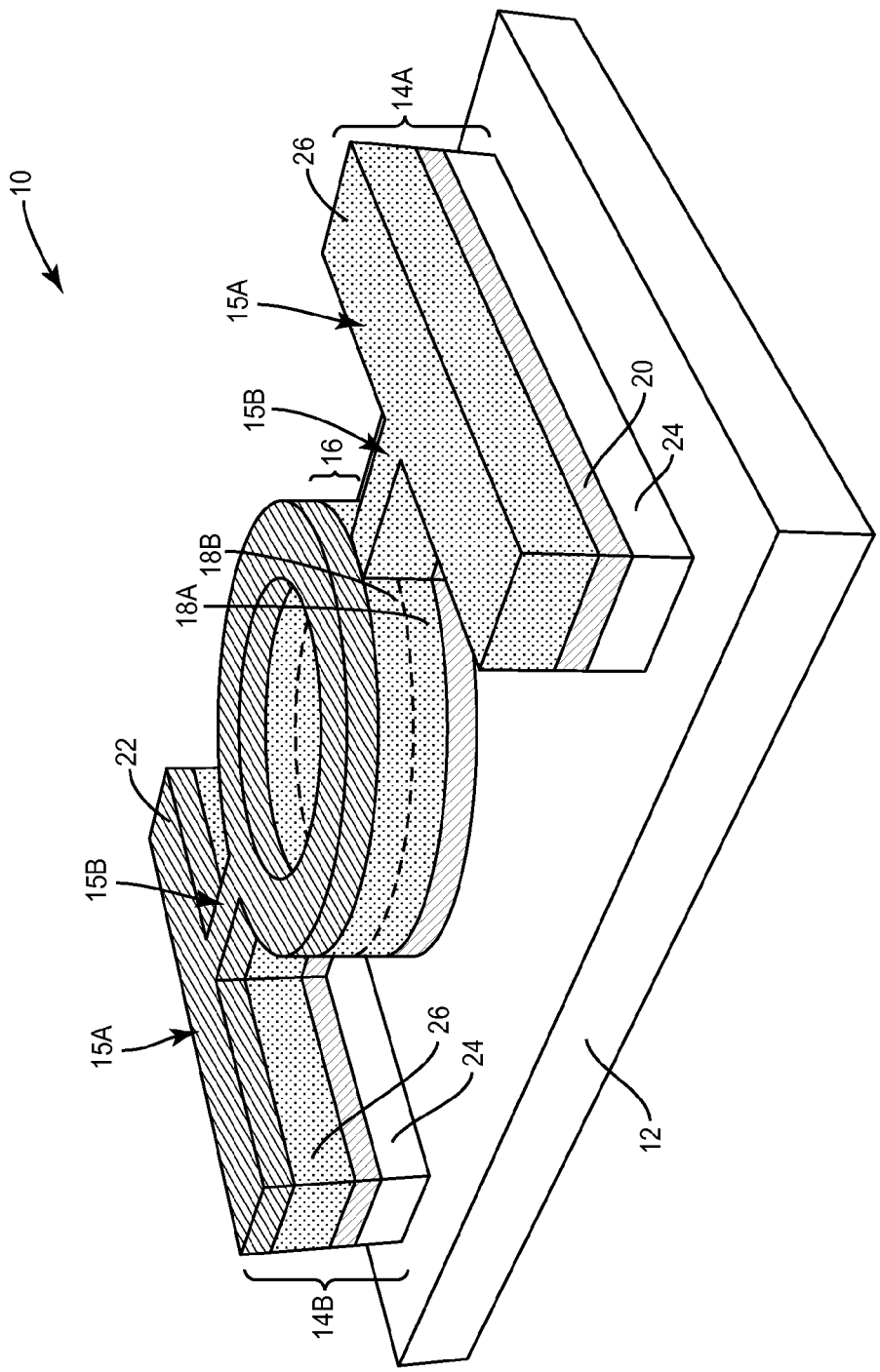
FIG. 7 shows a three-dimensional representation of a ring-shaped MEMS device according to one embodiment of the present disclosure.
Figure 8:
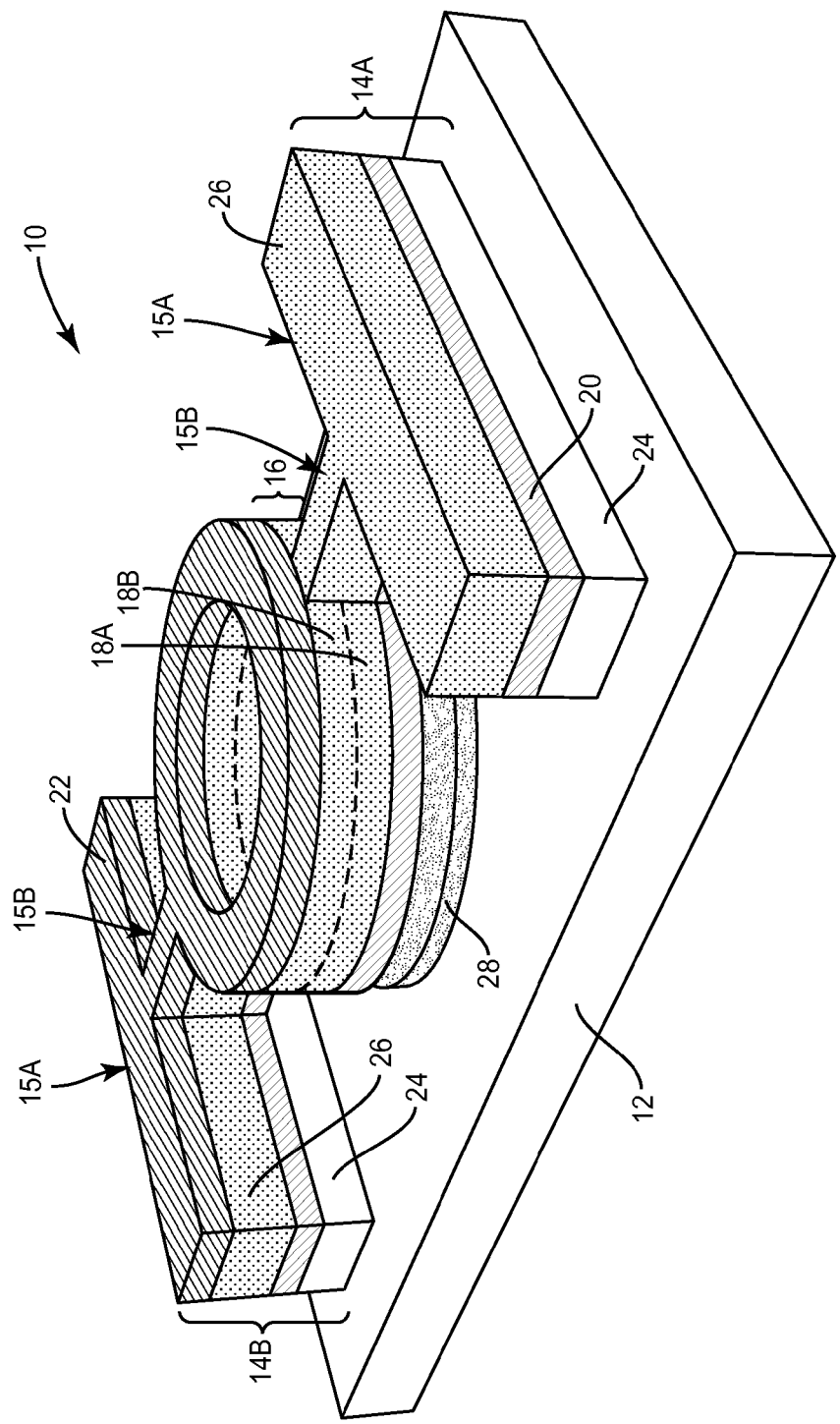
FIG. 8 shows a three-dimensional representation of the ring-shaped MEMS device shown in FIG. 7 according to an additional embodiment of the present disclosure.
Figure 9:
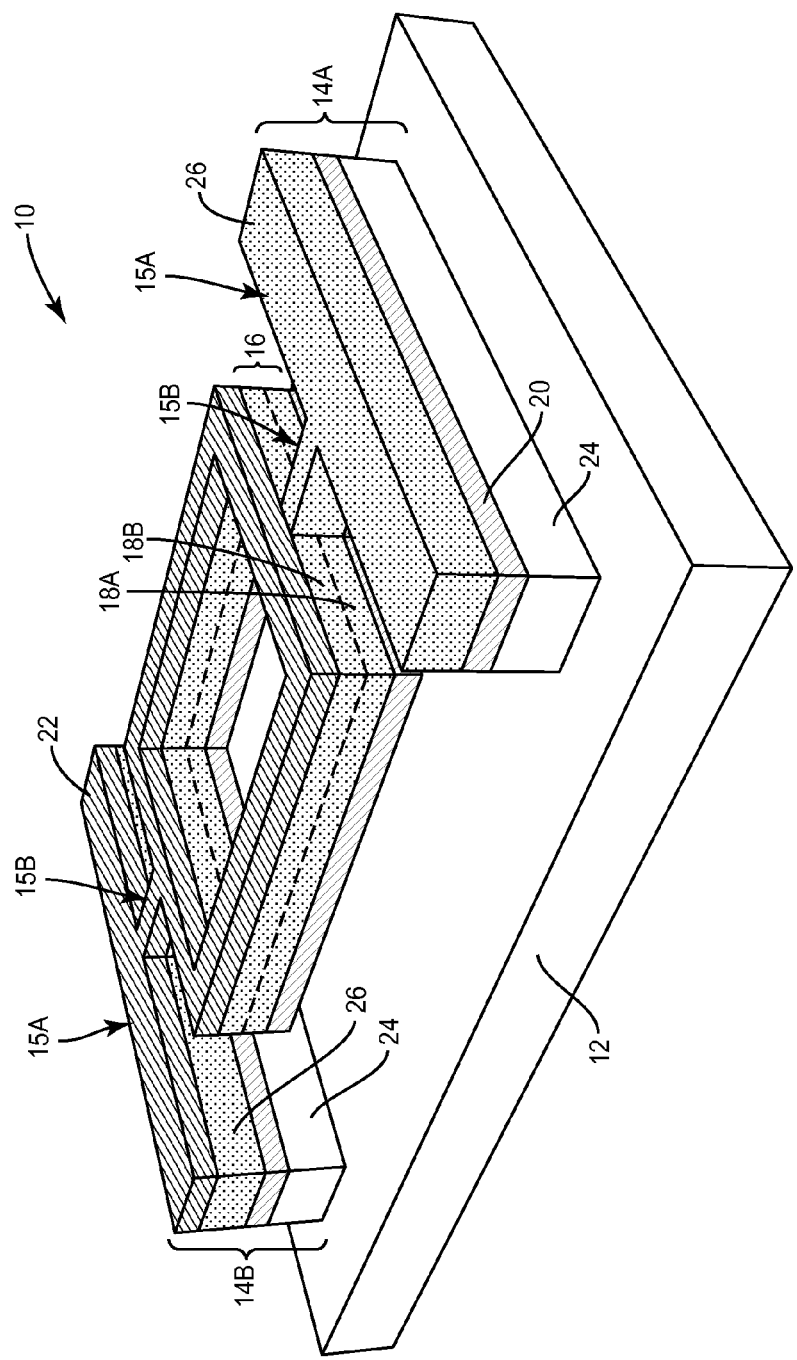
FIG. 9 shows a three-dimensional representation of a square-ring-shaped MEMS device according to one embodiment of the present disclosure.
Figure 10:
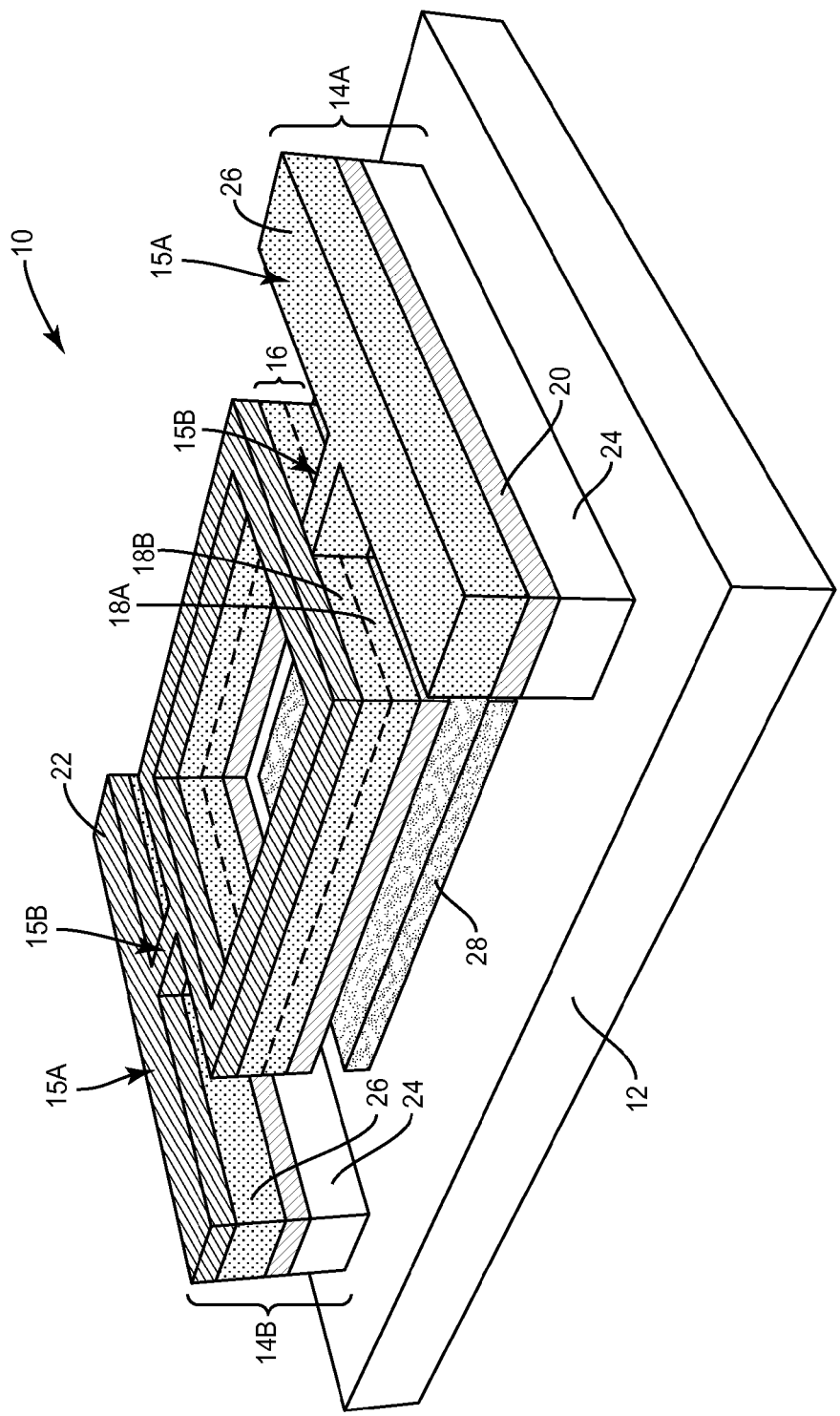
FIG. 10 shows a three-dimensional representation of the square-ring-shaped MEMS device shown in FIG. 9 according to an additional embodiment of the present disclosure.

FIGS. 5-10 show the MEMS device 10 according to additional embodiments of the present disclosure, each including different geometries for the piezoelectric layer 16. FIG. 5 shows the MEMS device 10 wherein the piezoelectric layer 16 is disk-shaped. FIG. 6 shows the MEMS device of FIG. 5 further including a third electrode 28, as discussed above with respect to FIG. 2. FIG. 7 shows the MEMS device 10 wherein the piezoelectric layer 16 is ring-shaped. FIG. 8 shows the MEMS device of FIG. 7 further including a third electrode 28, as discussed above with respect to FIG. 2. FIG. 9 shows the MEMS device 10 wherein the piezoelectric layer 16 is square-ring-shaped. FIG. 10 shows the MEMS device 10 of FIG. 9 further including a third electrode 28, as discussed above with respect to FIG. 2.

The MEMS devices 10 shown in FIGS. 5, 7, and 9 may function substantially similar to that shown in FIG. 1, wherein a DC voltage is applied between the first electrode 20 and the second electrode 22. The DC voltage may cause the piezoelectric layer 16 to mechanically deform, which may in turn cause changes in the elastic properties of the layer, the piezoelectric properties of the layer, the dielectric constants of the layer, and the distance between the first electrode 20 and the second electrode 22. The aforementioned changes in the piezoelectric layer 16 may lead to a change in the capacitance between the first electrode 20 and the second electrode 22. By carefully placing the anchors 14A and 14B in the MEMS device 10, the mechanical deformation of the piezoelectric layer 16 can be controlled with some degree of precision. Accordingly, the capacitance between the first electrode 20 and the second electrode 22 can be controlled by the level of the DC voltage placed between the first electrode 20 and the second electrode 22.

The MEMS devices 10 shown in FIGS. 6, 8, and 10 may function substantially similar to that shown in FIG. 2, wherein a DC voltage is applied between the first electrode 20 and the second electrode 22 in order to modulate the capacitance between the first electrode 20 and the second electrode 22. Alternatively, or simultaneously, a DC voltage may be placed between the first electrode 20 and the second electrode 22 in order to modulate a capacitance between the first electrode 20 and the third electrode 28. As discussed above, when a DC voltage is placed between the first electrode 20 and the second electrode 22, the piezoelectric layer 16 mechanically deforms, leading to changes in the elastic properties of the layer, the piezoelectric properties of the layer, the dielectric constants of the layer, the distance between the first electrode 20 and the second electrode 22, and the distance between the first electrode 20 and the third electrode 28.

By carefully placing the anchors 14A and 14B in the MEMS device 10, the mechanical deformation of the piezoelectric layer 16 can be controlled with some degree of precision. Accordingly, the capacitance between the first electrode 20 and the third electrode 28 can be controlled by the level of the DC voltage placed between the first electrode 20 and the second electrode 22. Further, at a certain level of the DC voltage, the deflection between the piezoelectric layer 16 and the substrate 12 may become large enough that the first electrode 20 contacts the third electrode 28. Accordingly, the DC voltage may be used to selectively place the first electrode 20 into contact with the third electrode 28 in order to form a switch.

The shape of the piezoelectric layer 16 may affect the type and extent of mechanical vibrations in the layer. Accordingly, changing the shape of the piezoelectric layer 16 will result in unique performance characteristics for each one of the MEMS devices 10 illustrated in FIGS. 1-10.

Figure 11:
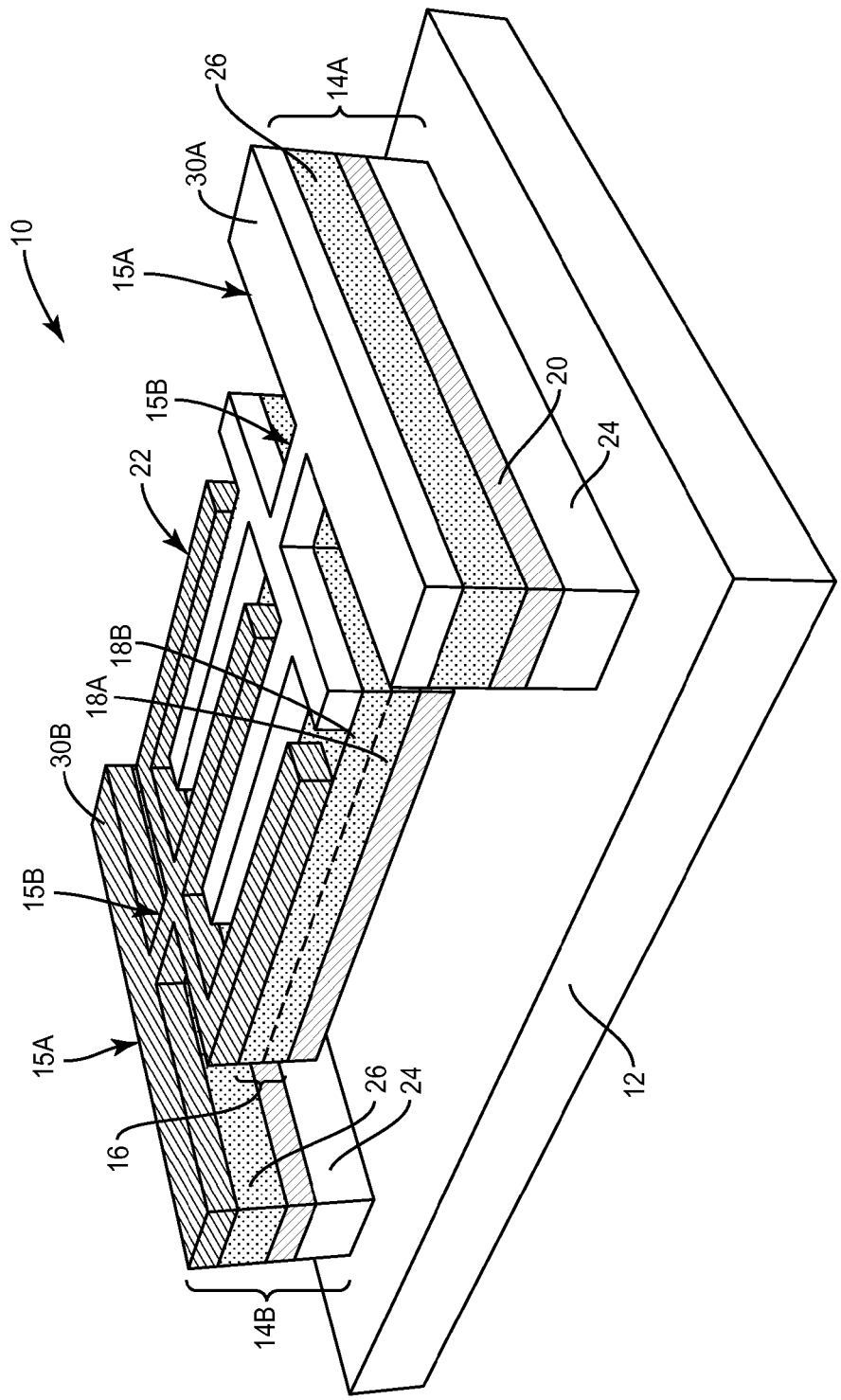
FIG. 11 shows a three-dimensional representation of an inter-digital-transducer (IDT) MEMS device according to one embodiment of the present disclosure.

FIG. 11 shows the MEMS device 10 according to an additional embodiment of the present disclosure. The MEMS device 10 shown in FIG. 11 is substantially similar to that shown in FIG. 1, except that the second electrode 22 shown in FIG. 11 is split into two sections, such that the second electrode 22 includes a first conducting section 30A and a second conducting section 30B. As shown in FIG. 11, the first conducting section 30A and the second conducting section 30B are inter-digitally dispersed with respect to one another on the second surface of the piezoelectric layer 16. Splitting the second electrode 22 into the first conducting section 30A and the second conducting section 30B allows the MEMS device 10 to be used as a tunable resonator or filter, as discussed in further detail below.

In operation, a DC voltage is applied between the first electrode 20 and each one of the first conducting section 30A and the second conducting section 30B of the second electrode 22. The DC voltage may cause the piezoelectric layer 16 to mechanically deform, which may cause changes in the elastic properties of the layer, the piezoelectric properties of the layer, the dielectric constants of the layer, the distance between the first electrode 20 and the second electrode 22, and the distance between the first conducting section 30A and the second conducting section 30B of the second electrode 22. The aforementioned changes in the piezoelectric layer 16 may lead to a change in the capacitance between the first electrode 20 and the second electrode 22, as well as the resonant frequency of the piezoelectric layer 16. By carefully placing the anchors 14A and 14B in the MEMS device 10, the mechanical deformation of the piezoelectric layer 16 may be controlled with some degree of precision. Accordingly, the capacitance between the first electrode 20 and the second electrode 22, as well as the resonant frequency of the piezoelectric layer 16 may be controlled by the level of the DC voltage placed between the first electrode 20 and the second electrode 22.

In one embodiment of the present disclosure, the first electrode 20 is also split into two conducting sections in substantially the same manner as the second electrode 22, such that each section of the first electrode 20 is inter-digitally dispersed with respect to one another on the first surface of the piezoelectric layer 16. In such an embodiment, a DC voltage may be applied between each conducting section of the first electrode 20 and each conducting section of the second electrode 22. The DC voltage may cause the piezoelectric layer 16 to mechanically deform, which may cause changes in the elastic properties of the layer, the piezoelectric properties of the layer, the dielectric constants of the layer, the distance between the first electrode 20 and the second electrode 22, and the distance between each conducting section in both the first electrode 20 and the second electrode 22. As discussed above, these changes may lead to control of the capacitance between the first electrode 20 and the second electrode 22, as well as the resonant frequency of the piezoelectric layer 16.

The resonant frequency of the piezoelectric layer 16 may be very important when considering the use of the MEMS device 10 as a resonator or filter. As will be appreciated by those of ordinary skill in the art, changing the resonant frequency of the piezoelectric layer 16 may result in a change the behavior of the MEMS device 10 when used as a resonator, as well as the filter response of the MEMS device 10 when used as a filter. Accordingly, the MEMS device 10 shown in FIG. 11 may be used as a variable capacitor or an adjustable resonator or filter. Further, at a certain level of the DC voltage, the deflection between the piezoelectric layer 16 and the substrate 12 may become large enough that the first electrode 20 is placed in contact with the substrate 12. When the first electrode 20 is placed in contact with the substrate, vibrations in the piezoelectric layer 16 may be dampened. Accordingly, the dampening of vibrations in the piezoelectric layer 16 may also be controlled by the level of the DC voltage placed between the first electrode 20 and the second electrode 22.

Figure 12:
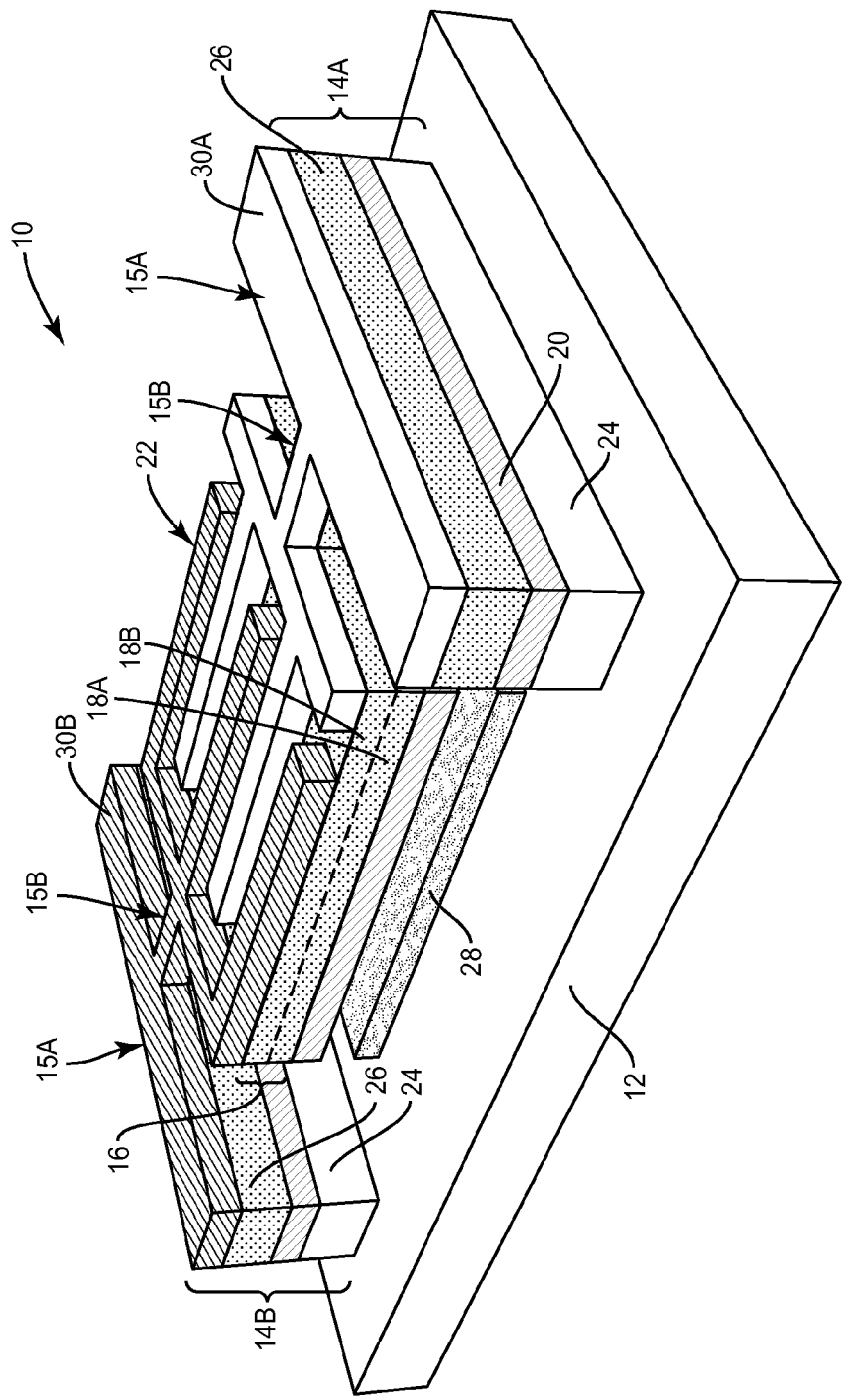
FIG. 12 shows a three-dimensional representation of the IDT MEMS device shown in FIG. 11 according to an additional embodiment of the present disclosure.

FIG. 12 shows the MEMS device 10 of FIG. 11 further including a third electrode 28 on the first surface of the substrate 12 below the first electrode 20. The MEMS device 10 shown in FIG. 12 may function in a substantially similar manner to that shown in FIG. 1, wherein a DC voltage is applied between the first electrode 20 and the second electrode 22 in order to modulate one or more properties of the piezoelectric layer 16. In addition to the previously described functionality, a DC voltage may also be applied between the first electrode 20 and the second electrode 22 in order to modulate a capacitance between the first electrode 20 and the third electrode 28. As discussed above, when a DC voltage is placed between the first electrode 20 and the second electrode 22, the piezoelectric layer 16 mechanically deforms, leading to changes in the elastic properties of the layer, the piezoelectric properties of the layer, the dielectric constants of the layer, the distance between the first electrode 20 and the second electrode 22, the distance between the first conducting section 30A and the second conducting section 30B of the second electrode, and the distance between the first electrode 20 and the third electrode 28.

By carefully placing the anchors 14A and 14B in the MEMS device 10, the mechanical deformation of the piezoelectric layer 16 can be controlled with some degree of precision. Accordingly, the capacitance between the first electrode 20 and the third electrode 28 can be controlled by the level of the DC voltage placed between the first electrode and the second electrode 22. Further, at a certain level of the DC voltage, the deflection between the piezoelectric layer 16 and the substrate 12 may become large enough such that the first electrode 20 contacts the third electrode 28. Accordingly, the DC voltage may be used in the MEMS device 10 to adjust one or more parameters of a resonator or filter response between the first conducting section 30A and the second conducting section 30B of the second electrode 22, to vary a capacitance between the first electrode 20 and the second electrode 22, to vary a capacitance between the first electrode 20 and the third electrode 28, or to selectively place the first electrode 20 into contact with the third electrode 28.

Figure 13:
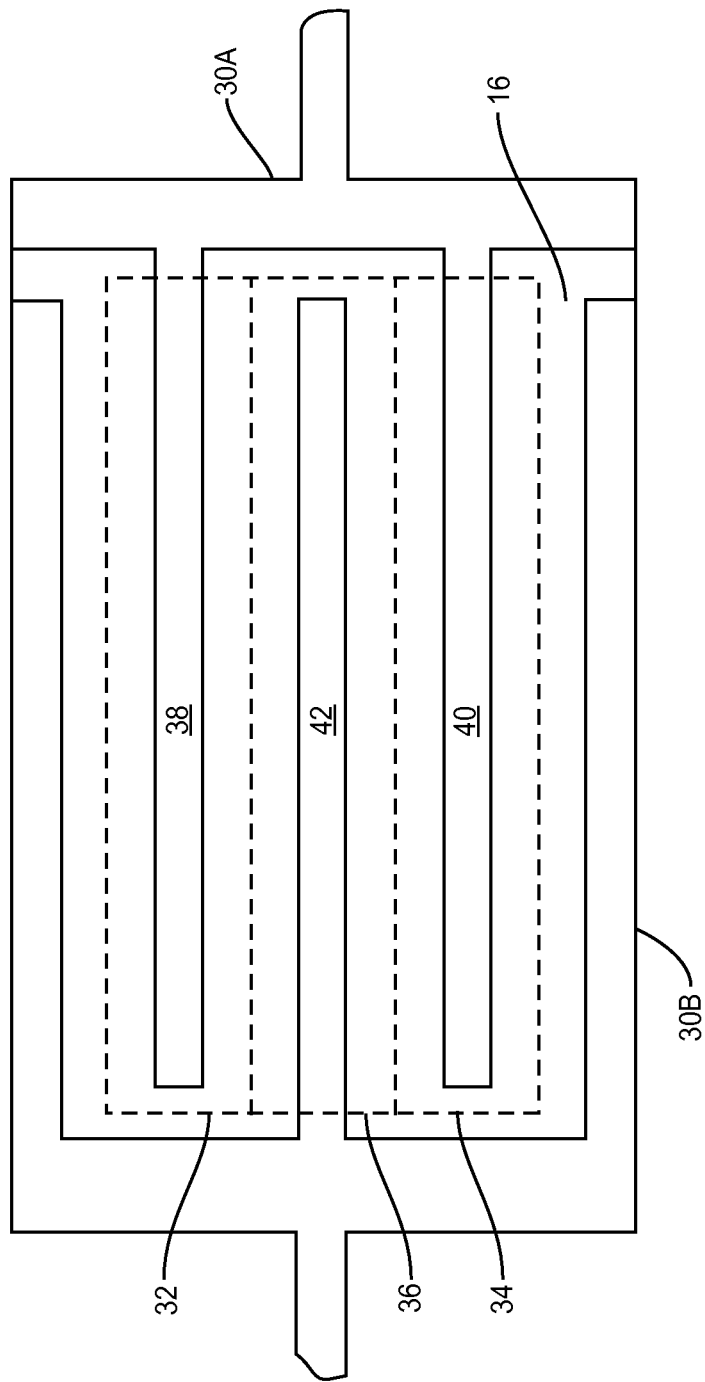
FIG. 13 shows a top view of the structure of the second electrode of the IDT MEMS device shown in FIGS. 11 and 12.

The term inter-digitally dispersed, as used herein, describes the physical layout of the first conducting section 30A and the second conducting section 30B of the second electrode 22, as shown in FIGS. 11 and 12, and further illustrated in FIG. 13. FIG. 13 shows a top view of the piezoelectric layer 16 of the MEMS device 10 according to one embodiment of the present disclosure. As shown in FIG. 13, the first conducting section 30A and the second conducting section 30B of the second electrode 22 segment the second surface of the piezoelectric layer 16 into a first segment 32, a second segment 34, and a third segment 36. Each of the first segment 32, the second segment 34, and the third segment 36 is rectangular in shape with the first conducting section 30A providing a first conducting finger 38 down the center of the first segment 32 and a second conducting finger 40 down the center of the second segment 34, and the second conducting section 30B providing a third conducting finger 42 down the center of the third segment 36.

Normally, a first AC voltage is applied to the first conducting section 30A, and a second AC voltage, which is phase-shifted about 180 degrees from the first AC voltage, is applied to the second conducting section 30B. Therefore, the voltages surrounding the first segment 32 and the second segment 34 are phase-shifted about 180 degrees from the voltage surrounding the third segment 36, which drives the first segment 32 and the second segment 34 in directions that are opposite to the direction of the third segment 36. By sub-dividing the surface of the piezoelectric layer 16 into segments, each segment may vibrate at a higher frequency than an un-segmented MEMS device 10. The higher frequencies may be better suited for certain RF applications.

In one embodiment of the present disclosure, the first electrode 20 is also split into two conducting sections in substantially the same manner as the second electrode 22, such that each section of the first electrode 20 is inter-digitally dispersed with respect to one another on the first surface of the piezoelectric layer 16. In such an embodiment, a DC voltage may be applied between each conducting section of the first electrode 20 and each conducting section of the second electrode 22. The DC voltage may cause the piezoelectric layer 16 to mechanically deform, which may cause changes in the elastic properties of the layer, the piezoelectric properties of the layer, the dielectric constants of the layer, the distance between the first electrode 20 and the second electrode 22, and the distance between each conducting section in both the first electrode 20 and the second electrode 22. As discussed above, these changes may lead to control of the capacitance between the first electrode 20 and the second electrode 22, as well as the resonant frequency of the piezoelectric layer 16.

As will be appreciated by those of ordinary skill in the art, alternative embodiments of the present disclosure may use any number of segments of any shape without departing from the principles described herein. Further, the first and second AC voltages may be sinusoidal or may be periodic waveforms of any shape.

Figure 14:
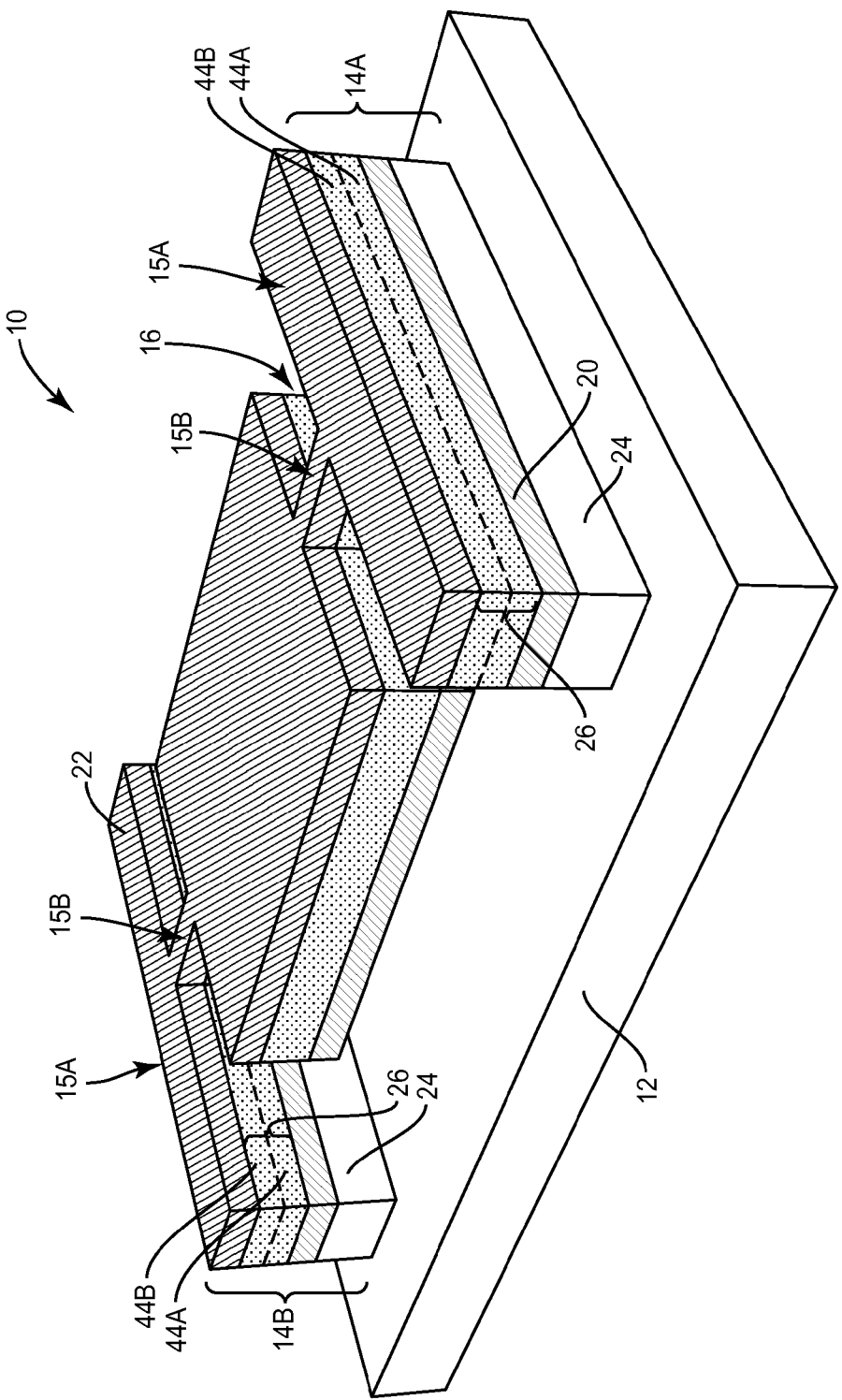
FIG. 14 shows a three-dimensional representation of a rectangular-shaped MEMS device according to one embodiment of the present disclosure.

FIG. 14 shows the MEMS device 10 according to an additional embodiment of the present disclosure. The MEMS device 10 shown in FIG. 14 is substantially similar to that shown in FIG. 1, except that the piezoelectric layer 16 shown in FIG. 14 is a single crystal piezoelectric material with a substantially uniform domain orientation. Additionally, the second anchor layer 26, which extends throughout the anchor portion 15A and the mechanical support member 15B of the first anchor 14A and the second anchor 14B, comprises a piezoelectric bimorph including a first anchor bimorph layer 44A and a second anchor bimorph layer 44B. Finally, the second electrode 22 extends over both the first anchor 14A and the second anchor 14B in the present embodiment. As shown in FIG. 14, the first electrode 20 is in contact with the first anchor bimorph layer 44A, while the second electrode 22 is in contact with the second anchor bimorph layer 44B. Accordingly, when a DC voltage is placed between the first electrode 20 and the second electrode 22, the second anchor layer 26 of the first anchor 14A and the second anchor 14B may mechanically deform, thereby modulating the distance between the first electrode 20 and the second electrode 22. Specifically, the mechanical deformation of each one of the mechanical support members 15B will move the piezoelectric layer 16 either closer to or further away from the substrate 12. As discussed above, as the distance between the first electrode 20 and the second electrode 22 changes, so does the capacitance between the first electrode 20 and the second electrode 22. Further, providing a DC voltage between the first electrode 20 and the second electrode 22 may modulate the resonant frequency of the piezoelectric layer 16. Accordingly, the DC voltage may be used to adjust one or more operating parameters of the MEMS device 10.

Figure 15:
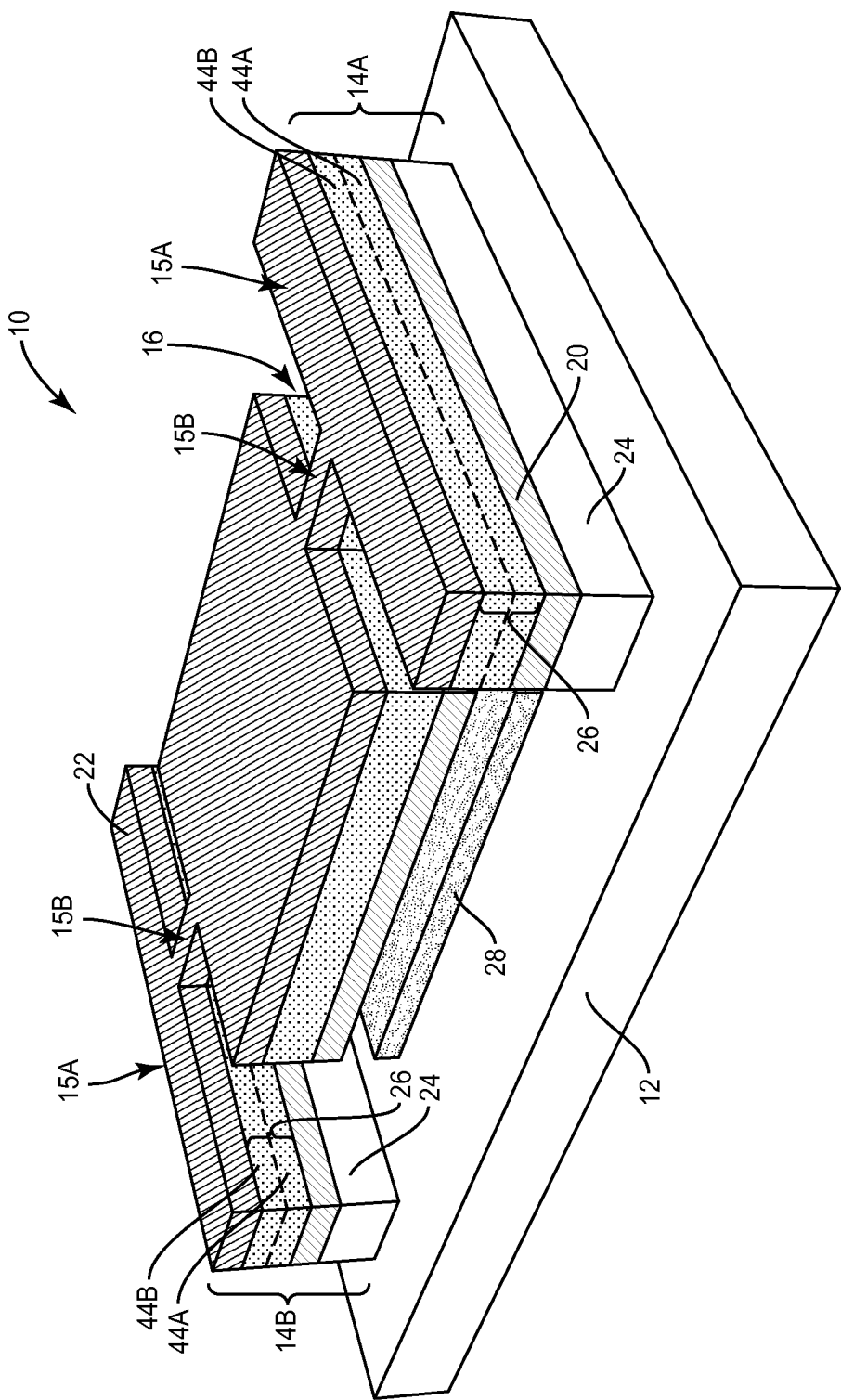
FIG. 15 shows a three-dimensional representation of the rectangular-shaped MEMS device shown in FIG. 14 according to an additional embodiment of the present disclosure.

FIG. 15 shows the MEMS device 10 according to an additional embodiment of the present disclosure. The MEMS device 10 shown in FIG. 15 is substantially similar to that shown in FIG. 14, except that the MEMS device 10 further includes a third electrode 28 on the first surface of the substrate 12 below the first electrode 20. The MEMS device 10 shown in FIG. 15 may function in a substantially similar manner to that shown in FIG. 14, wherein a DC voltage is applied between the first electrode 20 and the second electrode 22 in order to modulate one or more properties of the piezoelectric layer 16. In addition to the previously described functionality, a DC voltage may also be applied between the first electrode 20 and the second electrode 22 in order to modulate a capacitance between the first electrode 20 and the third electrode 28. As discussed above, when a DC voltage is placed between the first electrode 20 and the second electrode 22, the second anchor layer 26 of the first anchor 14A and the second anchor 14B may mechanically deform, thereby modulating the distance between the first electrode 20 and the third electrode 28. As the distance between the first electrode 20 and the third electrode 28 changes, so does a capacitance between the first electrode 20 and the third electrode 28. Further, providing a DC voltage between the first electrode 20 and the second electrode 22 may modulate the resonant frequency of the piezoelectric layer 16. Accordingly, the DC voltage may be used to adjust one or more operating parameters of the MEMS device 10.

Figure 16:
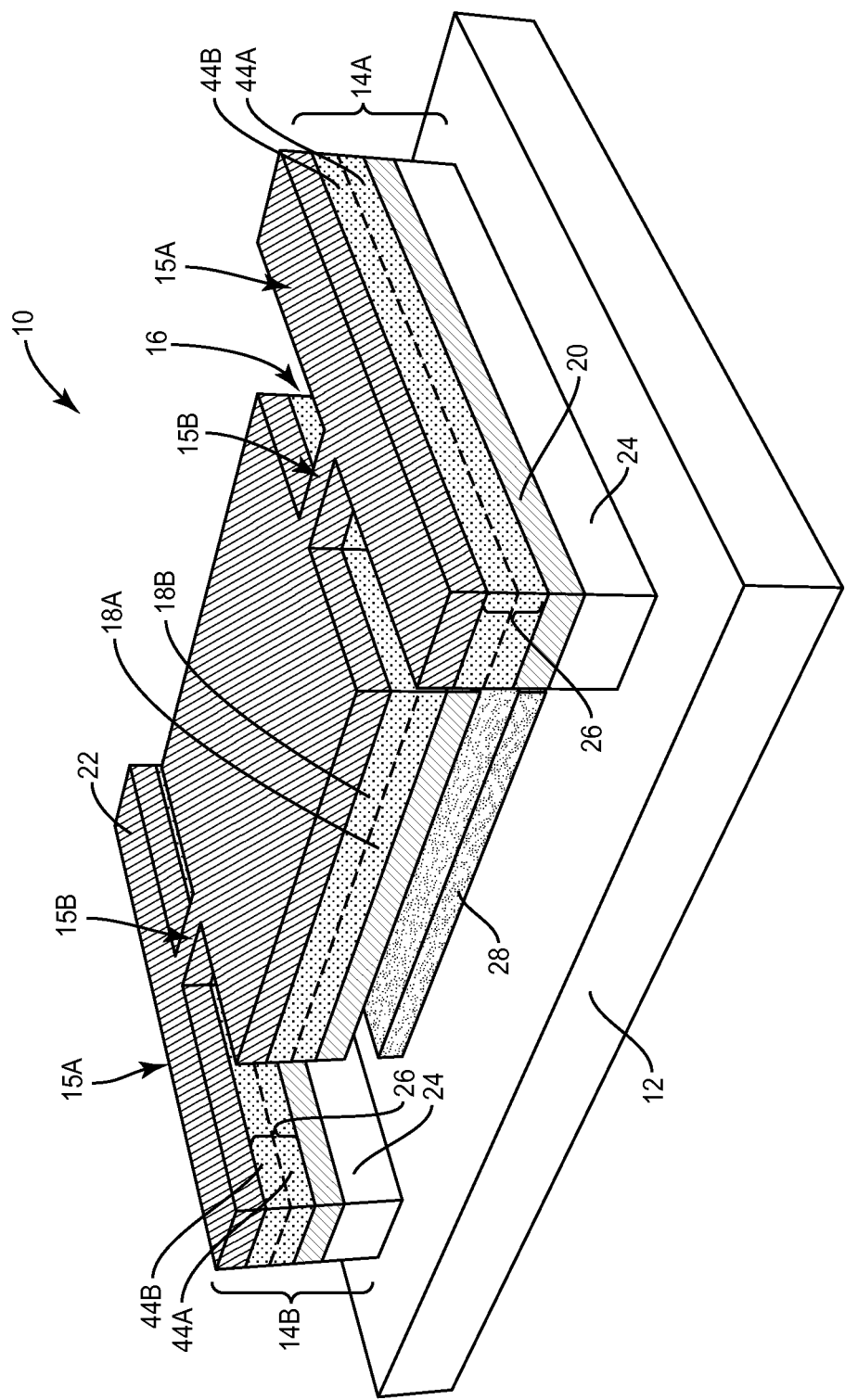
FIG. 16 shows a three-dimensional representation of the rectangular-shaped MEMS device shown in FIG. 15 according to an additional embodiment of the present disclosure.

FIG. 16 shows the MEMS device 10 according to an additional embodiment of the present disclosure. The MEMS device 10 shown in FIG. 16 is substantially similar to that shown in FIG. 15, except that in the MEMS device 10 shown in FIG. 16, the second anchor layer 26 of the first anchor 14A and the second anchor 14B, as well as the piezoelectric layer 16 are bimorph layers, such that the piezoelectric layer 16 includes a first bimorph layer 18A and a second bimorph layer 18B, and the second anchor layer 26 includes a first anchor bimorph layer 44A and a second anchor bimorph layer 44B. The MEMS device 10 shown in FIG. 16 may function in a substantially similar manner to the devices described above, but may offer performance enhancements in some applications, for instance, when a large amount of deflection is required between one or more electrodes in the MEMS device 10.

Figure 17:
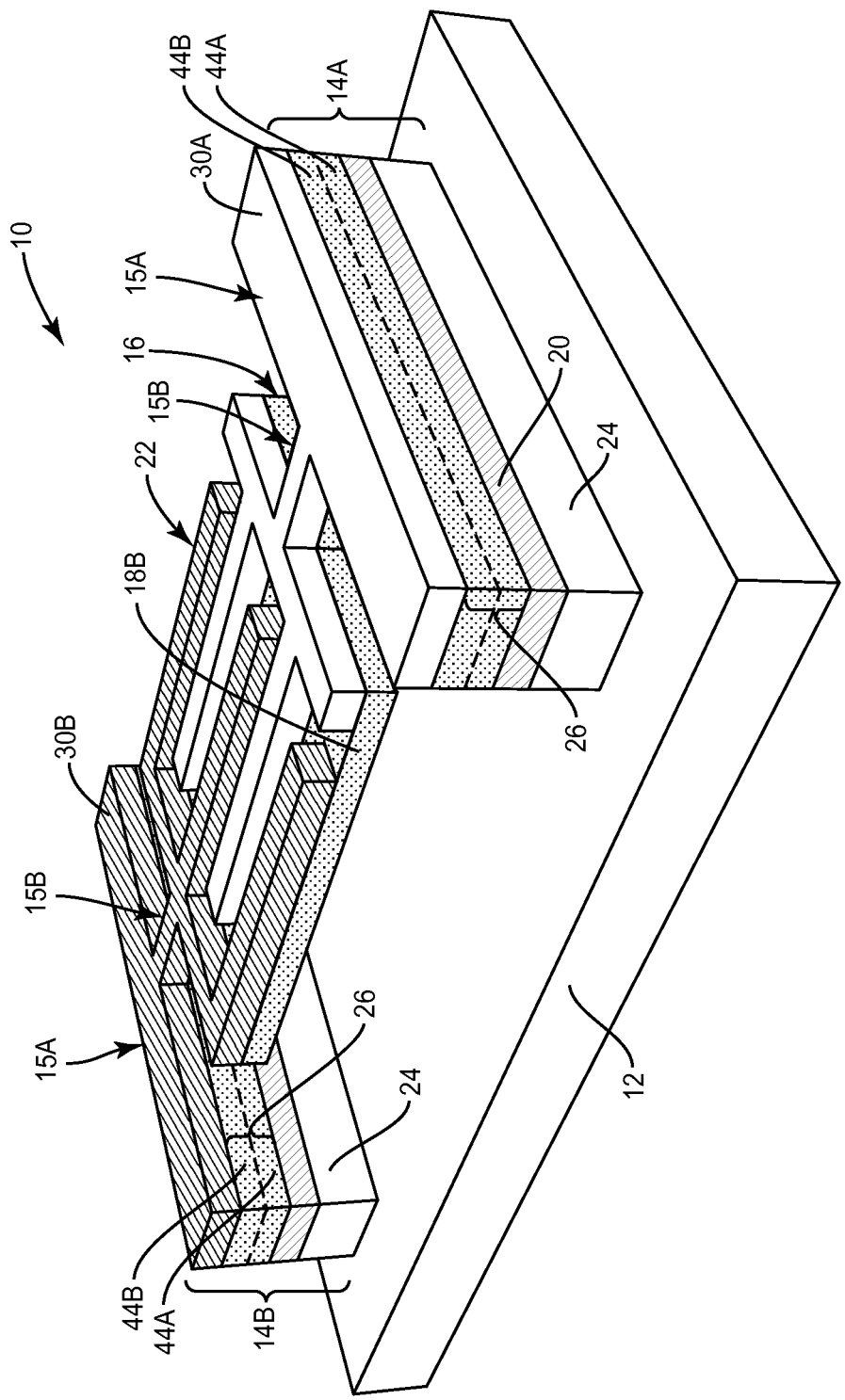
FIG. 17 shows a three-dimensional representation of an IDT MEMS device according to one embodiment of the present disclosure.

FIG. 17 shows the MEMS device 10 according to an additional embodiment of the present disclosure. The MEMS device 10 shown in FIG. 17 is substantially similar to that shown in FIG. 11, except that in the MEMS device 10 shown in FIG. 17, the piezoelectric bimorph layer 16 only includes the second bimorph layer 18B, while the second anchor layer 26 of the first anchor 14A and the second anchor 14B still includes the first anchor bimorph layer 44A and the second anchor bimorph layer 44B. The MEMS device 10 shown in FIG. 17 may function in a substantially similar way to the devices described above, but may offer performance enhancements in some applications, for instance, when the resonant behavior of the piezoelectric layer 16 is desired to be primarily limited to a single vibrational mode.

The MEMS devices described above with respect to FIG. 1-17 may find applications as adjustable resonators, capacitors, switches, or any combination thereof. The multi-functional nature of the MEMS devices may enable a single MEMS device to replace a number of discrete components, thereby streamlining one or more devices in which the MEMS device is integrated. Further, the MEMS devices described above may be used in optical guidance or switching applications. In one embodiment, the amount of mechanical deformation of the piezoelectric layer 16 may be controlled in order to direct or modulate by the principle of specular reflection, refraction, or Bragg scattering, the light emitted from a laser or other light source. Additionally, the MEMS devices described above may be used in inertial sensing applications. In one embodiment, physical movement of the MEMS device 10 results in a piezoelectric signal generated between one or more electrodes in the device, which is subsequently processed and used to detect the motion or orientation of the device.

Any of the MEMS devices described above with respect to FIGS. 1-17 may be fabricated on a single composite wafer, such that the wafer includes a variety of MEMS devices suitable for performing various tasks. Accordingly, specialized wafers may be developed for specific applications requiring MEMS devices of different functionalities. By stacking multiple layers of different functionalities in a composite wafer, the MEMS devices described here may be integrated with semiconductor or optical devices, for example.

Figure 18A:
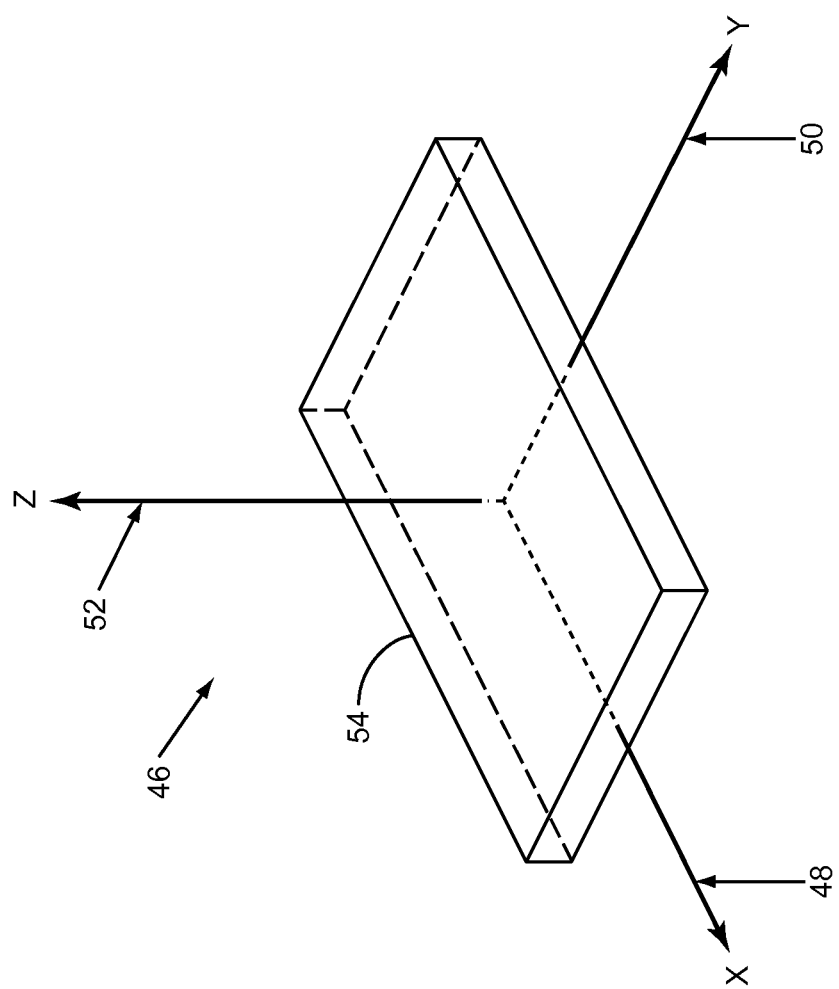
FIGS. 18A-18D show a three dimensional representation of a crystalline structure including one or more rotated Cartesian coordinate systems according to one embodiment of the present disclosure.

As discussed above, each one of the first bimorph layer 18A and the second bimorph layer 18B of the piezoelectric layer 16 may be a single crystal piezoelectric material with a uniform crystalline orientation. FIGS. 18A-18D show Cartesian coordinate systems for illustrating orientations of the uniform crystalline structure relative to each one of the first bimorph layer 18A, the second bimorph layer 18B, the first anchor bimorph layer 44A, and the second anchor bimorph layer 44B. FIG. 18A illustrates an exemplary crystalline structure 54, which may represent the crystalline structure of the first bimorph layer 18A, the second bimorph layer 18B, the first anchor bimorph layer 44A, or the second anchor bimorph layer 44B. The crystalline structure 54 may be provided from a z-cut wafer from a z-oriented boule, which is a single-crystal ingot. As shown in FIG. 18A, the shape of the crystalline structure 54 is aligned with a Cartesian coordinate system 46, such that an X-axis 48 is aligned with an outer length of the crystalline structure 54, a Y-axis 50 is aligned with an outer width of the crystalline structure 54, and a Z-axis 52 is aligned with a thickness of the crystalline structure 54.

In order to describe the orientation of the crystalline structure 54 relative to the shape of the structure, the crystalline structure 54 will remain aligned with the Cartesian coordinate system 46 while the Cartesian coordinate system 46 is rotated to create one or more rotated Cartesian coordinate systems, each of which demonstrates a Euler angle representing the relative angle of the orientation of the crystalline structure 54 in one dimension with respect to the shape of the crystalline structure 54. Since the disk-shaped and circular-ring shaped MEMS devices 10 (shown in FIGS. 5-8) do not have a discernible outer length or outer width, the X-axis 48 and the Y-axis 50 for these MEMS devices 10 are arbitrary.

Figure 18B:
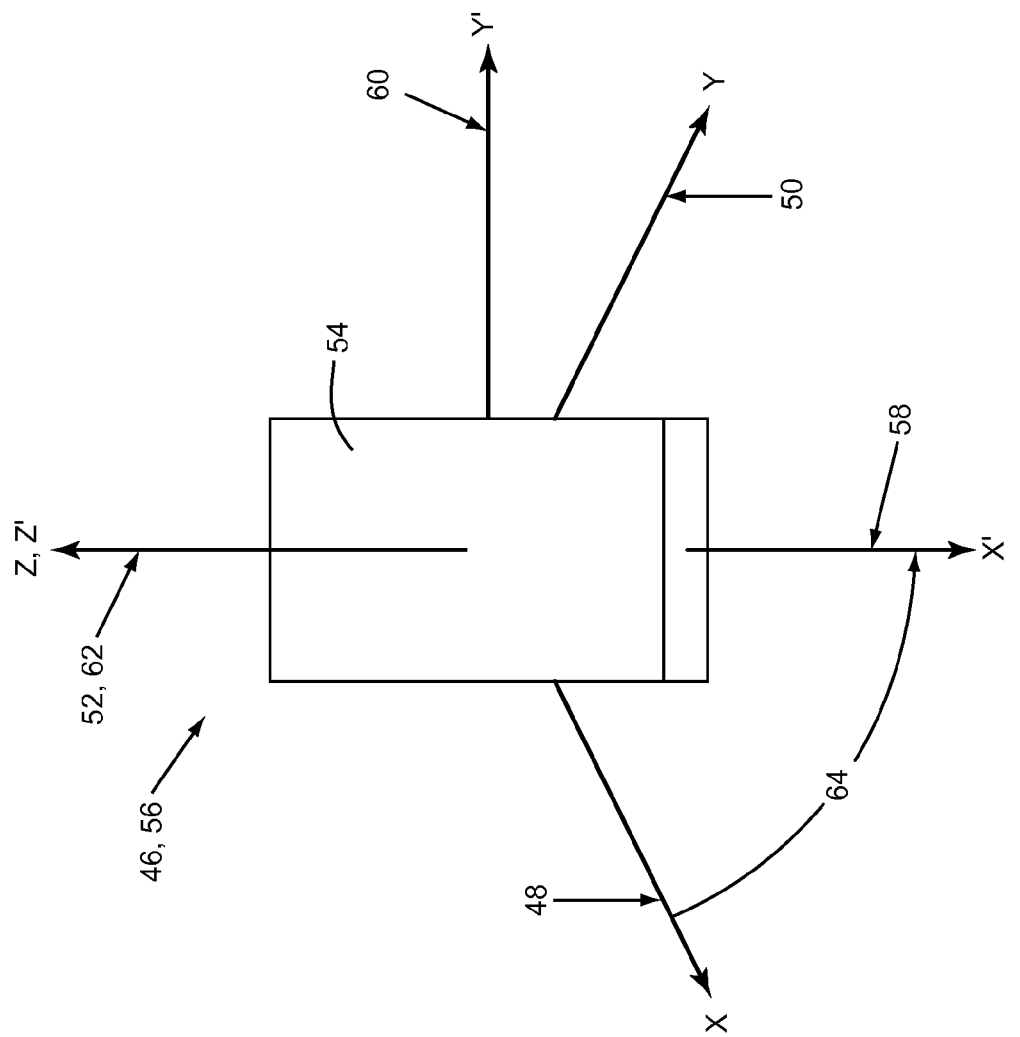

FIG. 18B shows the Cartesian coordinate system 46, which is coincident with the shape of the crystalline structure 54. Further, FIG. 18B shows a first rotated Cartesian coordinate system 56, which is obtained by keeping the Z-axis 52 of the Cartesian coordinate system 46 stationary and rotating the X-axis 48 towards the Y-axis 50 to form a first rotated X-axis 58, a first rotated Y-axis 60, and a first rotated Z-axis 62, which are all perpendicular to one another. Because the Z-axis 52 was kept stationary, the first rotated Z-axis 62 is coincident with the Z-axis 52. A first Euler angle 64 is the angle formed between the X-axis 48 and the first rotated X-axis 58.

Figure 18C:
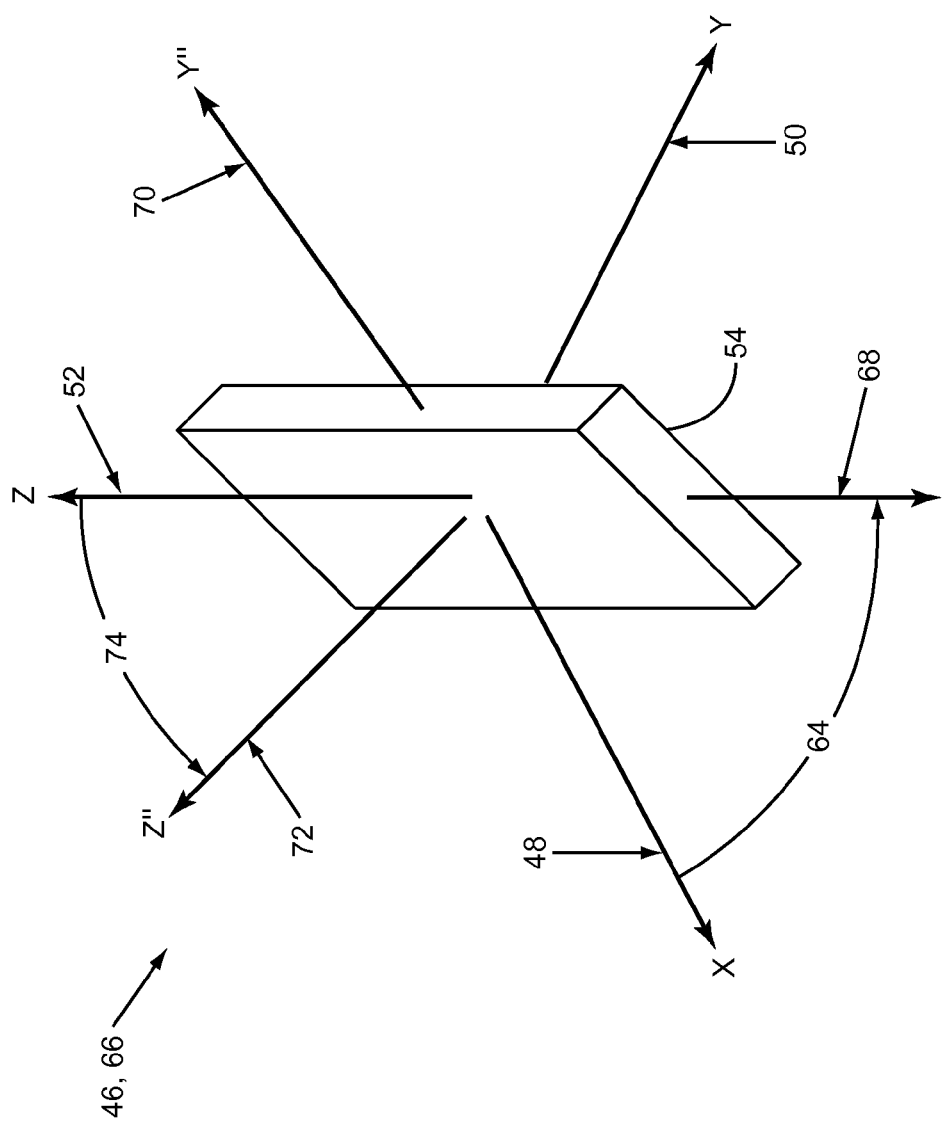

FIG. 18C shows the Cartesian coordinate system 46 and a second rotated Cartesian coordinate system 66, which is obtained by keeping the first rotated X-axis 58 stationary and rotating the first rotated Z-axis 62 away from the first rotated Y-axis 60 to form a second rotated X-axis 68, a second rotated Y-axis 70, and a second rotated Z-axis 72, which are all perpendicular to one another. Because the first rotated X-axis 58 was kept stationary, the first rotated X-axis 58 is coincident with the second rotated X-axis 68. A second Euler angle 74 is the angle formed between the Z-axis 52 and the second rotated Z-axis 72. Since the first rotated Z-axis 62 is coincident with the Z-axis 52, the second Euler angle 74 is also equal to the angle formed between the first rotated Z-axis 62 and the second rotated Z-axis 72.

Figure 18D:
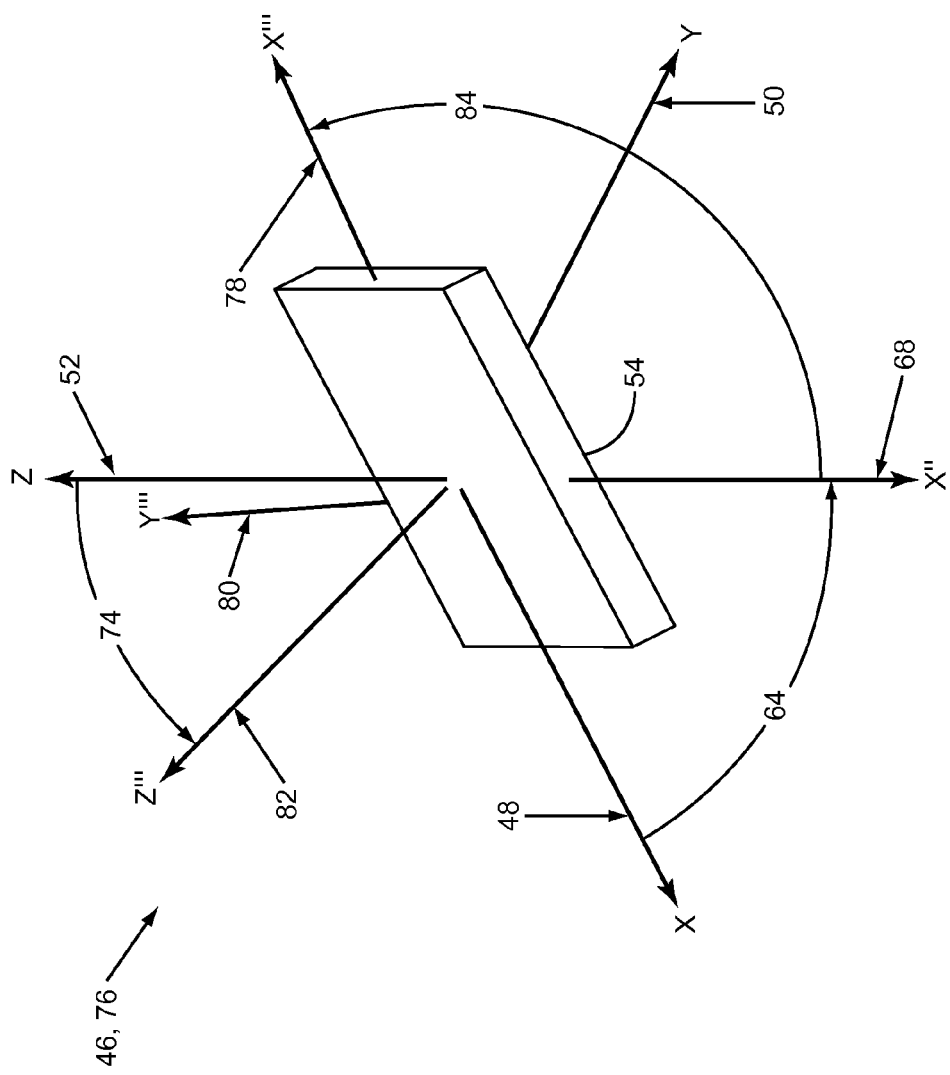

FIG. 18D shows the Cartesian coordinate system 46 and a third rotated Cartesian coordinate system 76, which is obtained by keeping the second rotated Z-axis 72 stationary and rotating the second rotated X-axis 68 towards the second rotated Y-axis 70 to form a third rotated X-axis 78, a third rotated Y-axis 80, and a third rotated Z-axis 82, which are all perpendicular to one another. Because the second rotated Z-axis 72 was kept stationary, the second rotated Z-axis 72 is coincident with the third rotated Z-axis 82. A third Euler angle 84 is the angle formed between the second rotated X-axis 68 and the third rotated X-axis 78. Since the first rotated X-axis 58 is coincident with the second rotated X-axis 68, the third Euler angle 84 is also equal to the angle formed between the first rotated X-axis 58 and the third rotated X-axis 78.

The first Euler angle 64 is often referred to as Phi ($\phi$), the second Euler angle 74 is often referred to as Theta ($\theta$), and the third Euler angle 84 is often referred to as Psi ($\psi$). The Euler angles chosen for a particular single crystal piezoelectric layer thus define the crystalline orientation relative to the shape of the structure. Accordingly, the Euler angles chosen for a particular single crystal piezoelectric layer determine the performance characteristics of the particular layer. For example, the Euler angles may determine a dominant vibrational angle within the layer and the resonant frequency of the layer.

According to one embodiment of the MEMS devices 10 described above in FIGS. 1-17, the orientation of the crystalline structure of the first bimorph layer 18A, the second bimorph layer 18B, the first anchor bimorph layer 44A, and the second anchor bimorph layer 44B is defined by a set of Euler angles. Further, the orientation of the crystalline structure of the first bimorph layer 18A and the second bimorph layer 18B, as well as the first anchor bimorph layer 44A and the second anchor bimorph layer 44B, may be chosen independently of one another, such that the set of Euler angles associated with each one of the first bimorph layer 18A and the second bimorph layer 18B, or the first anchor bimorph layer 44A and the second anchor bimorph layer 44B, are different from one another. Independently choosing the orientation of the crystalline structure for each one of the first bimorph layer 18A and the second bimorph layer 18B, as well as the first anchor bimorph layer 44A and the second anchor bimorph layer 44B, may allow the designer to optimize one or more performance characteristics of the MEMS device 10 in which they are incorporated.

In certain applications of the MEMS devices 10 described above in FIGS. 1-17, it may be desirable to maximize the electric potential achieved by the piezoelectric layer 16. Choosing Euler angles about the range of values specified by Equation (1) may yield an electric potential within 20% of the maximum value for a device operating primarily in a longitudinal mode of vibration.

$$|[\sin(\phi+n*120°)\cos\psi+\cos(\phi+n*120°)\cos\theta\sin\psi]\cos(38°)+\sin\theta\sin\psi\sin(38°)|\leq\cos\alpha \quad (1)$$

where n=−1, 0, 1, (ϕ, θ, ψ) represent a first Euler angle, a second Euler angle, and a third Euler angle, respectively, and α=27°. Using a combination of Euler angles that satisfy Equation (1) to define the crystalline orientation of the first bimorph layer 18A or the second bimorph layer 18B of the piezoelectric layer 16 may yield desirable performance characteristics when the mode of vibration of the MEMS device 10 is primarily longitudinal. For example, choosing a set of Euler angles to satisfy Equation (1) for each one of the first bimorph layer 18A and the second bimorph layer 18B may yield a minimized temperature coefficient, a maximized electromechanical coupling coefficient, maximum bandwidth, or any combination thereof.

As will be understood by those of ordinary skill in the art, due to the behavior of the first bimorph layer 18A and the second bimorph layer 18B in the piezoelectric layer 16, the piezoelectric layer 16 may experience a variety of vibrational modes simultaneously, rather than predominantly operating in a single mode of vibration. Using the range of Euler angles specified by Equation (1) for defining the orientation of the crystalline structure of the first bimorph layer 18A and the second bimorph layer 18B may nonetheless yield desirable performance characteristics of a MEMS device 10 incorporating the piezoelectric layer 16.

For a MEMS device 10 operating primarily in a shear-horizontal mode of vibration, Euler angles about the range of values specified by Equations (2) and (3) may yield an electric potential within 20% of the maximum value.

$$|\sin\theta\sin\psi|\leq\cos 45° \quad (2)$$

$$|\sin(\phi+n*120°)\sin\psi+\sqrt{3}\sin\theta\cos\psi-\cos(\phi+n*120°)\cos\theta\cos\psi|\geq 1 \quad (3)$$

where n=−1, 0, 1, and (ϕ, θ, ψ) represent a first Euler angle, a second Euler angle, and a third Euler angle, respectively. Using any combination of Euler angles that satisfy Equations (2) and (3) to define the orientation of the crystalline structure of the first bimorph layer 18A and the second bimorph layer 18B of the piezoelectric layer 16 may yield desirable performance characteristics when the mode of vibration of the MEMS device 10 is primarily shear-horizontal. For example, choosing a set of Euler angles to satisfy Equations (2) and (3) for each one of the first bimorph layer 18A and the second bimorph layer 18B may yield a minimized temperature coefficient, a maximized electromechanical coupling coefficient, maximum bandwidth, or any combination thereof.

As will be understood by those of ordinary skill in the art, due to the behavior of the first bimorph layer 18A and the second bimorph layer 18B in the piezoelectric layer 16, the piezoelectric layer 16 may experience a variety of vibrational modes simultaneously, rather than predominantly operating in a single mode of vibration. Using the range of Euler angles specified by Equations (2) and (3) for defining the orientation of the crystalline structure of the first bimorph layer 18A and the second bimorph layer 18B may nonetheless yield desirable performance characteristics of a MEMS device 10 incorporating the piezoelectric layer 16.

Those skilled in the art will recognize improvements and modifications to the embodiments of the present disclosure. All such improvements and modifications are considered within the scope of the concepts disclosed herein and the claims that follow.

What is claimed is:

1. A micro-electrical-mechanical system (MEMS) device comprising:
    a substrate;
    one or more anchors formed on a first surface of the substrate;
    a piezoelectric layer suspended over the first surface of the substrate by the one or more anchors, wherein the piezoelectric layer is a piezoelectric bimorph;
    a first electrode on a first surface of the piezoelectric layer facing the first surface of the substrate; and
    a second electrode on a second surface of the piezoelectric layer opposite the first surface.

2. The MEMS device of claim 1 wherein a DC voltage is applied between the first electrode and the second electrode in order to vary a capacitance between the first electrode and the second electrode.

3. The MEMS device of claim 1 wherein the piezoelectric bimorph comprises a first bimorph layer and a second bimorph layer.

4. The MEMS device of claim 3 wherein the first electrode is in contact with the first bimorph layer and the second electrode is in contact with the second bimorph layer.

5. The MEMS device of claim 4 wherein a DC voltage is applied between the first electrode and the second electrode in order to vary a capacitance between the first electrode and the second electrode.

6. The MEMS device of claim 3 wherein the first bimorph layer and the second bimorph layer comprise a single crystal piezoelectric material having a uniform crystalline orientation.

7. The MEMS device of claim 6 wherein the uniform crystalline orientation of the first bimorph layer is defined by a first set of Euler angles, and the uniform crystalline orientation of the second bimorph layer is defined by a second set of Euler angles.

8. The MEMS device of claim 7 wherein the first set of Euler angles is different from the second set of Euler angles.

9. A micro-electrical-mechanical system (MEMS) device comprising:
    a substrate;
    one or more anchors formed on a first surface of the substrate;
    a piezoelectric layer suspended over the first surface of the substrate by the one or more anchors, wherein the piezoelectric layer is a piezoelectric bimorph;
    a first electrode on a first surface of the piezoelectric layer facing the first surface of the substrate;
    a second electrode on a second surface of the piezoelectric layer opposite the first surface; and
    a third electrode on the first surface of the substrate below the first electrode.

10. The MEMS device of claim 9 wherein a DC voltage is applied between the first electrode and the second electrode in order to vary a capacitance between the first electrode and the third electrode.

11. The MEMS device of claim 10 wherein a DC voltage is applied between the first electrode and the second electrode in order to selectively place the first electrode in contact with the third electrode.

12. The MEMS device of claim 9 wherein the piezoelectric bimorph comprises a first bimorph layer and a second bimorph layer.

13. The MEMS device of claim 12 wherein the first electrode is in contact with the first bimorph layer and the second electrode is in contact with the second bimorph layer.

14. The MEMS device of claim 13 wherein a DC voltage is applied between the first electrode and the second electrode in order to vary a capacitance between the first electrode and the third electrode.

15. The MEMS device of claim 13 wherein a DC voltage is applied between the first electrode and the second electrode in order to selectively place the first electrode in contact with the third electrode.

16. The MEMS device of claim 12 wherein the first bimorph layer and the second bimorph layer comprise a single crystal piezoelectric material having a uniform crystalline orientation.

17. The MEMS device of claim 16 wherein the uniform crystalline orientation of the first bimorph layer is defined by a first set of Euler angles, and the uniform crystalline orientation of the second bimorph layer is defined by a second set of Euler angles.

18. The MEMS device of claim 17 wherein the first set of Euler angles is different from the second set of Euler angles.

19. A micro-electrical-mechanical system (MEMS) device comprising:
  a substrate;
  one or more anchors formed on a first surface of the substrate, each of the one or more anchors comprising at least one piezoelectric anchor layer, wherein the at least one piezoelectric anchor layer is a piezoelectric bimorph;
  a piezoelectric layer suspended over the first surface of the substrate by the one or more anchors;
  a first electrode on a first surface of the piezoelectric layer facing the first surface of the substrate;
  a second electrode on a second surface of the piezoelectric layer opposite the first surface; and
  a third electrode on the first surface of the substrate below the first electrode.

20. The MEMS device of claim 19 wherein a DC voltage is applied between the first electrode and the second electrode in order to vary a capacitance between the first electrode and the third electrode.

21. The MEMS device of claim 19 wherein a DC voltage is applied between the first electrode and the second electrode in order to selectively place the first electrode in contact with the third electrode.

22. The MEMS device of claim 19 wherein the piezoelectric anchor layer comprises a first bimorph layer and a second bimorph layer.

23. The MEMS device of claim 22 wherein the first electrode is in contact with the first bimorph layer and the second electrode is in contact with the second bimorph layer.

24. The MEMS device of claim 23 wherein a DC voltage is applied between the first electrode and the second electrode in order to vary a capacitance between the first electrode and the third electrode.

25. The MEMS device of claim 23 wherein a DC voltage is applied between the first electrode and the second electrode in order to selectively place the first electrode in contact with the third electrode.

26. The MEMS device of claim 22 wherein the first bimorph layer and the second bimorph layer comprise a single crystal piezoelectric material having a uniform crystalline orientation.

27. The MEMS device of claim 26 wherein the uniform crystalline orientation of the first bimorph layer is defined by a first set of Euler angles, and the uniform crystalline orientation of the second bimorph layer is defined by a second set of Euler angles.

28. The MEMS device of claim 27 wherein the first set of Euler angles is different from the second set of Euler angles.

29. The MEMS device of claim 19 wherein the piezoelectric layer is a piezoelectric bimorph.

* * * * *

UNITED STATES PATENT AND TRADEMARK OFFICE
CERTIFICATE OF CORRECTION

PATENT NO. : 9,466,430 B2
APPLICATION NO. : 14/071025
DATED : October 11, 2016
INVENTOR(S) : Kushal Bhattacharjee Page 1 of 1

It is certified that error appears in the above-identified patent and that said Letters Patent is hereby corrected as shown below:

In the Specification

In Column 15, equation (1), second line, replace "$\cos(38°) + \sin\theta \sin\psi \sin(38°)| \leq \cos\alpha$" with -- $\cos(38°) + \sin\theta \sin\psi \sin(38°)| \geq \cos\alpha$ --.

Signed and Sealed this
Thirty-first Day of January, 2017

Michelle K. Lee
*Director of the United States Patent and Trademark Office*